(12) United States Patent
Shen

(10) Patent No.: US 7,635,876 B2
(45) Date of Patent: Dec. 22, 2009

(54) LED PACKAGE STRUCTURE AND METHOD OF PACKAGING THE SAME

(76) Inventor: Yu-Nung Shen, No. 60, Lane 328, Li-Shan Street, Nei-Hu Dist., Taipei City (TW)

( * ) Notice: Subject to any disclaimer, the term of this patent is extended or adjusted under 35 U.S.C. 154(b) by 588 days.

(21) Appl. No.: 11/302,127

(22) Filed: Dec. 14, 2005

(65) Prior Publication Data

US 2006/0243999 A1    Nov. 2, 2006

(30) Foreign Application Priority Data

Apr. 29, 2005    (TW) ............................. 94113941 A

(51) Int. Cl.
*H01L 29/74*    (2006.01)
*H01L 21/00*    (2006.01)

(52) U.S. Cl. ..................... 257/100; 438/34; 438/35; 257/E33.057; 257/E33.059

(58) Field of Classification Search .................. 438/31, 438/34, 35; 257/E33.057, E33.059, E33.066, 257/E33.072, E33.075, 100, 98
See application file for complete search history.

(56) References Cited

U.S. PATENT DOCUMENTS

2004/0129944 A1*    7/2004    Chen ........................... 257/89

\* cited by examiner

*Primary Examiner*—Walter L Lindsay, Jr.
(74) *Attorney, Agent, or Firm*—Houston Eliseeva LLP

(57) ABSTRACT

An LED package structure includes a first LED chip, a second LED chip arranged on the minor light-emitting surface of the first LED chip, a conductive unit connected between the electrode areas for parallel or serially connecting the two LED chips together, and two external electric conduction units for electrically connecting both the first and second electrode areas of the first LED chip with an external circuit.

21 Claims, 23 Drawing Sheets

# LED PACKAGE STRUCTURE AND METHOD OF PACKAGING THE SAME

BACKGROUND OF THE INVENTION

1. Field of the Invention

The present invention relates to a LED package structure and method of packaging the same, and particularly relates to a LED package structure including at least two LED chip and a method for package the LED package structure with the at least two LED chip.

2. Description of the Related Art

In recent years, the application of LED has been already more and more extensive. However, the manufacturers of foreign countries hold all most key technologies, so that Taiwan's manufacturer needs to pay a larger sum of the technology transfer fee or patent authorized fee, especially white LED and LED with exceeding high light.

Hence, it is important to overcome the above-mentioned questions and develop new LED package structure and method for packaging the same.

SUMMARY OF THE INVENTION

The present invention provides a LED package structure and method of packaging the same.

A first aspect of the invention is an LED package structure, comprising: a first LED chip for triggering to generate first color light, wherein the first LED chip has a major light-emitting surface, a minor light-emitting surface opposite to the major light-emitting surface, at least one first electrode area with a first pole arranged on one side of the minor light-emitting surface, and a second electrode area with a second pole arranged on opposite side of the minor light-emitting surface, wherein the polarity of the first electrode area is opposite to the second electrode area, and external light is allowed to pass through the minor light-emitting surface; at least one second LED chip for triggering to generate second color light, wherein the at least one second LED chip is arranged on the minor light-emitting surface of the first LED chip, and the second LED chip has a major light-emitting surface, a minor light-emitting surface opposite to the major light-emitting surface, a first electrode area with a first pole formed on one of the major and minor light-emitting surfaces, and a second electrode area with a second pole arranged on one of the major and the minor light-emitting surfaces; a conductive unit connected between the electrode areas for parallel or serially connecting the two LED chips together; and at least two external electric conduction units for electrically connecting both the first and second electrode areas of the first LED chip with an external circuit.

A second aspect of the invention is an LED package structure, comprising: a transparent substrate having an installed surface and at least two conductive points formed on the installed surface; a first LED chip for triggering to generate first color light, wherein the first LED chip has a major light-emitting surface, a minor light-emitting surface opposite to the major light-emitting surface, at least one first electrode area with a first pole arranged on one side of the minor light-emitting surface, and a second electrode area with a second pole arranged on opposite side of the minor light-emitting surface, wherein the polarity of the first electrode area is opposite to the second electrode area, and external light is allowed to pass through the minor light-emitting surface; wherein the major light-emitting surface of the first LED chip faces the installed surface of the substrate, and the first LED chip is arranged on the installed surface of the substrate; at least one second LED chip for triggering to generate second color light, wherein the at least one second LED chip is arranged on the minor light-emitting surface of the first LED chip, and the second LED chip has a major light-emitting surface, a minor light-emitting surface opposite to the major light-emitting surface, a first electrode area with a first pole formed on one of the major and minor light-emitting surfaces, and a second electrode area with a second pole arranged on one of the major and the minor light-emitting surfaces; a conductive unit connected between the electrode areas and between the electrode area and the conductive point for parallel or serially connecting the two LED chips together; and at least two external electric conduction units for electrically connecting the two corresponding conductive points of the substrate with an external circuit.

A third aspect of the invention is an LED package structure, comprising: an industrial sapphire layer arranged in two LED chip areas; two first electrode layers with first pole arranged on the industrial sapphire and in the corresponding two LED chip area; two second electrode layers with second pole arranged on the two first electrode layer respectively, wherein the polarity of the second pole is opposite to the first pole, and each second electrode layer is covered on a part of the corresponding first electrode layer; an insulating layer formed on the first electrode layer and the second electrode layer, wherein the insulating layer has a plurality of exposed holes formed therein for exposing a corresponding part of each electrode layer; a cover layer formed on the insulating layer to form a plurality of communication holes, wherein one exposed hole for exposing one of the electrode layers in one of LED chip areas and another exposed hole for exposing the other electrode layer in the other LED chip area, are communicated with each other via one communication hole, wherein the other exposed holes for exposing the other electrode layers in the corresponding LED chip areas are communicated with the other corresponding communication holes; a plurality of conductive bodies, each formed in each corresponding exposed hole and each corresponding communication hole that is communicated with the each corresponding exposed hole; a protection layer formed on the cover layer, and having a plurality of through holes formed therein, wherein each through hole exposes a part of each corresponding conductive body; and a plurality of external electric conduction units, each formed in each exposed hole, wherein each external electric conduction unit has a first portion for electrically connecting with the corresponding conductive body, and a second portion electrically connected with the first portion and projected outside the corresponding through hole.

A fourth aspect of the invention is an LED package structure, comprising: an industrial sapphire layer arranged in two LED chip areas; two first electrode layers with first pole arranged on the industrial sapphire and in the corresponding two LED chip area; two second electrode layers with second pole arranged on the two first electrode layer respectively, wherein the polarity of the second pole is opposite to the first pole, and each second electrode layer is covered on a part of the corresponding first electrode layer; an insulating layer formed on the first electrode layer and the second electrode layer, wherein the insulating layer has a plurality of exposed holes formed therein for exposing a corresponding part of each electrode layer; a cover layer formed on the insulating layer to form a plurality of communication holes, wherein two exposed holes for respectively exposing the two electrode layers in two of the LED chip areas and another exposed hole for exposing the electrode layer whose polarity is opposite to the two electrode layers in the two of the LED chip areas in the other LED chip area, are communicated with each other via the corresponding communication hole; a plurality of conductive bodies, each formed in each corresponding exposed hole and each corresponding communication hole that is communicated with the each corresponding exposed hole; a protection layer formed on the cover layer, and having a plurality of through holes formed therein, wherein each through hole exposes a part of each corresponding conductive body; and a plurality of external electric conduction units, each formed in each exposed hole, wherein each external electric conduction unit has a first portion for electrically connecting with the corresponding conductive body, and a second portion electrically connected with the first portion and projected outside the corresponding through hole.

A fifth aspect of the invention is an LED package structure, comprising: an industrial sapphire layer arranged in two LED chip areas; two first electrode layers with first pole arranged on the industrial sapphire and in the corresponding two LED chip area; two second electrode layers with second pole arranged on the two first electrode layer respectively, wherein the polarity of the second pole is opposite to the first pole, and each second electrode layer is covered on a part of the corresponding first electrode layer; an insulating layer formed on the first electrode layer and the second electrode layer, wherein the insulating layer has a plurality of exposed holes formed therein for exposing a corresponding part of each electrode layer; a cover layer formed on the insulating layer to form a plurality of communication holes, wherein one exposed hole for exposing the first electrode layer in the first LED chip area and another exposed hole for exposing the first electrode layer in the second LED chip area, are communicated with each other via one communication hole, and the polarity of the first electrode layer in the first LED chip area is same as the first electrode layer in the second LED chip area; wherein one exposed hole for exposing the second electrode layer in the first LED chip area and another exposed hole for exposing the first electrode layer in the third LED chip area, are communicated with each other via another communication hole, and the polarity of the second electrode layer in the first LED chip area is opposite to the first electrode layer in the third LED chip area; wherein one exposed hole for exposing the second electrode layer in the second LED chip area and another exposed hole for exposing the part of the second electrode layer in the third LED chip area, are communicated with each other via another communication hole, and the polarity of the second electrode layer in the second LED chip area is same as the second electrode layer in the third LED chip area; a plurality of conductive bodies, each formed in each corresponding exposed hole and each corresponding communication hole that is communicated with the each corresponding exposed hole; a protection layer formed on the cover layer, and having a plurality of through holes formed therein, wherein each through hole exposes each corresponding conductive body that is electrically connected with two electrode layers with same polarity in two LED chip areas together; and a plurality of external electric conduction units, each formed in each exposed hole, wherein each external electric conduction unit has a first portion for electrically connecting with the corresponding conductive body, and a second portion electrically connected with the first portion and projected outside the corresponding through hole.

A sixth aspect of the invention is a method for packaging an LED package structure, comprising the steps of: providing a first LED chip for triggering to generate first color light, wherein the first LED chip has a major light-emitting surface, a minor light-emitting surface opposite to the major light-emitting surface, at least one first electrode area with a first pole arranged on one side of the minor light-emitting surface, and a second electrode area with a second pole arranged on opposite side of the minor light-emitting surface, wherein the polarity of the first electrode area is opposite to the second electrode area, and external light is allowed to pass through the minor light-emitting surface; providing at least one second LED chip for triggering to generate second color light, wherein the at least one second LED chip is arranged on the minor light-emitting surface of the first LED chip, and the second LED chip has a major light-emitting surface, a minor light-emitting surface opposite to the major light-emitting surface, a first electrode area with a first pole formed on one of the major and minor light-emitting surfaces, and a second electrode area with a second pole arranged on one of the major and the minor light-emitting surfaces; setting a conductive unit connected between the electrode areas for parallel or serially connecting the two LED chips together; and forming at least two external electric conduction units for electrically connecting both the first and second electrode areas of the first LED chip with an external circuit.

A seventh aspect of the invention is a method for packaging an LED package structure, comprising the steps of: providing a transparent substrate having an installed surface and at least two conductive points formed on the installed surface; providing a first LED chip for triggering to generate first color light, wherein the first LED chip has a major light-emitting surface, a minor light-emitting surface opposite to the major light-emitting surface, at least one first electrode area with a first pole arranged on one side of the minor light-emitting surface, and a second electrode area with a second pole arranged on opposite side of the minor light-emitting surface, wherein the polarity of the first electrode area is opposite to the second electrode area, and external light is allowed to pass through the minor light-emitting surface; wherein the major light-emitting surface of the first LED chip faces the installed surface of the substrate, and the first LED chip is arranged on the installed surface of the substrate; providing at least one second LED chip for triggering to generate second color light, wherein the at least one second LED chip is arranged on the minor light-emitting surface of the first LED chip, and the second LED chip has a major light-emitting surface, a minor light-emitting surface opposite to the major light-emitting surface, a first electrode area with a first pole formed on one of the major and minor light-emitting surfaces, and a second electrode area with a second pole arranged on one of the major and the minor light-emitting surfaces; providing a conductive unit connected between the electrode areas and between the electrode area and the conductive point for parallel or serially connecting the two LED chips together; and providing at least two external electric conduction units for electrically connecting the two corresponding conductive points of the substrate with an external circuit.

An eighth aspect of the invention is a method for packaging an LED package structure, comprising the steps of: an industrial sapphire layer arranged in two LED chip areas; two first electrode layers with first pole arranged on the industrial sapphire and in the corresponding two LED chip area; two second electrode layers with second pole arranged on the two first electrode layer respectively, wherein the polarity of the second pole is opposite to the first pole, and each second electrode layer is covered on a part of the corresponding first electrode layer; an insulating layer formed on the first electrode layer and the second electrode layer, wherein the insulating layer has a plurality of exposed holes formed therein for exposing a corresponding part of each electrode layer; a cover layer formed on the insulating layer to form a plurality of communication holes, wherein one exposed hole for exposing one of the electrode layers in one of LED chip areas and another exposed hole for exposing the other electrode layer in the other LED chip area, are communicated with each other via one communication hole, wherein the other exposed holes for exposing the other electrode layers in the corresponding LED chip areas are communicated with the other corresponding communication holes; a plurality of conductive bodies, each formed in each corresponding exposed hole and each corresponding communication hole that is communicated with the each corresponding exposed hole; a protection layer formed on the cover layer, and having a plurality of through holes formed therein, wherein each through hole exposes a part of each corresponding conductive body; and a plurality of external electric conduction units, each formed in each exposed hole, wherein each external electric conduction unit has a first portion for electrically connecting with the corresponding conductive body, and a second portion electrically connected with the first portion and projected outside the corresponding through hole.

A ninth aspect of the invention is a method for packaging an LED package structure, comprising the steps of: an industrial sapphire layer arranged in two LED chip areas; two first electrode layers with first pole arranged on the industrial sapphire and in the corresponding two LED chip area; two second electrode layers with second pole arranged on the two first electrode layer respectively, wherein the polarity of the second pole is opposite to the first pole, and each second electrode layer is covered on a part of the corresponding first electrode layer; an insulating layer formed on the first electrode layer and the second electrode layer, wherein the insulating layer has a plurality of exposed holes formed therein for exposing a corresponding part of each electrode layer; a cover layer formed on the insulating layer to form a plurality of communication holes, wherein two exposed holes for respectively exposing the two electrode layers in two of the LED chip areas and another exposed hole for exposing the electrode layer whose polarity is opposite to the two electrode layers in the two of the LED chip areas in the other LED chip area, are communicated with each other via the corresponding communication hole; a plurality of conductive bodies, each formed in each corresponding exposed hole and each corresponding communication hole that is communicated with the each corresponding exposed hole; a protection layer formed on the cover layer, and having a plurality of through holes formed therein, wherein each through hole exposes a part of each corresponding conductive body; and a plurality of external electric conduction units, each formed in each exposed hole, wherein each external electric conduction unit has a first portion for electrically connecting with the corresponding conductive body, and a second portion electrically connected with the first portion and projected outside the corresponding through hole.

A tenth aspect of the invention is a method for packaging an LED package structure, comprising the steps of: an industrial sapphire layer arranged in two LED chip areas; two first electrode layers with first pole arranged on the industrial sapphire and in the corresponding two LED chip area; two second electrode layers with second pole arranged on the two first electrode layer respectively, wherein the polarity of the second pole is opposite to the first pole, and each second electrode layer is covered on a part of the corresponding first electrode layer; an insulating layer formed on the first electrode layer and the second electrode layer, wherein the insulating layer has a plurality of exposed holes formed therein for exposing a corresponding part of each electrode layer; a cover layer formed on the insulating layer to form a plurality of communication holes, wherein one exposed hole for exposing the first electrode layer in the first LED chip area and another exposed hole for exposing the first electrode layer in the second LED chip area, are communicated with each other via one communication hole, and the polarity of the first electrode layer in the first LED chip area is same as the first electrode layer in the second LED chip area; wherein one exposed hole for exposing the second electrode layer in the first LED chip area and another exposed hole for exposing the first electrode layer in the third LED chip area, are communicated with each other via another communication hole, and the polarity of the second electrode layer in the first LED chip area is opposite to the first electrode layer in the third LED chip area; wherein one exposed hole for exposing the second electrode layer in the second LED chip area and another exposed hole for exposing the part of the second electrode layer in the third LED chip area, are communicated with each other via another communication hole, and the polarity of the second electrode layer in the second LED chip area is same as the second electrode layer in the third LED chip area; a plurality of conductive bodies, each formed in each corresponding exposed hole and each corresponding communication hole that is communicated with the each corresponding exposed hole; a protection layer formed on the cover layer, and having a plurality of through holes formed therein, wherein each through hole exposes each corresponding conductive body that is electrically connected with two electrode layers with same polarity in two LED chip areas together; and a plurality of external electric conduction units, each formed in each exposed hole, wherein each external electric conduction unit has a first portion for electrically connecting with the corresponding conductive body, and a second portion electrically connected with the first portion and projected outside the corresponding through hole.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF PREFERRED BEST MOLDS

Figure 50:
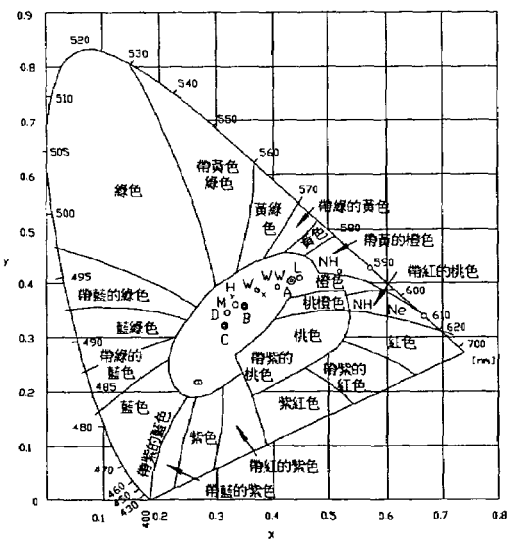
FIG. 50 is a chromaticity diagram of CIE (Commission International de l'Eclairage/International Commission on Illumination)

Referring to FIG. 50, the color of light is decided by a light wavelength. Hence different light wavelengths can be mixed to form light with another light wavelength, in other words to form light with another color according to another light wavelength. For example two light wavelength ranges, if first light(blue) with light wavelength range between 450 nm to 470 nm and second light(yellow) with light wavelength range between 570 nm to 590 nm are mixed, one white light with light wavelength range between 480 nm to 490 nm is produced. For example three light wavelength ranges, if first light (blue) with light wavelength range between 450 nm to 470 nm, second light (green) with light wavelength range between 520 nm to 540 nm, and third light (red) with light wavelength range between 610 nm to 630 nm all are mixed, one white light with all light wavelength range is produced.

Figure 1:
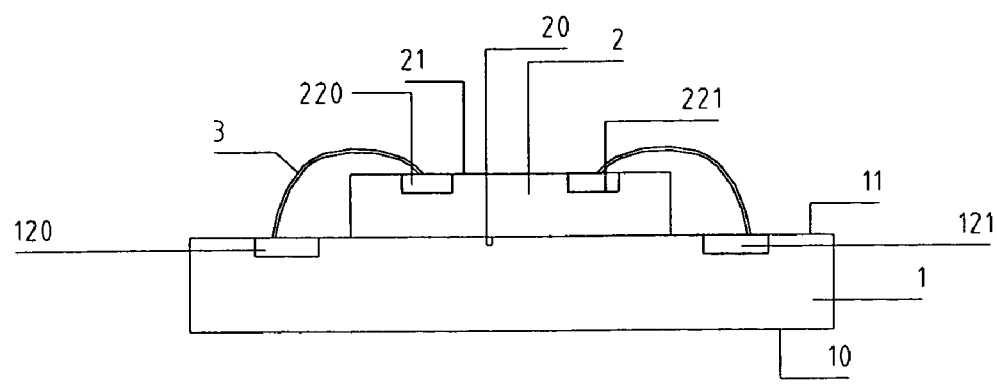
FIGS. 1 to 3 are three schematic, cross-sectional, flowcharts of a method for packaging an LED package structure according to the first best mold of the present invention, respectively.
Figure 2:
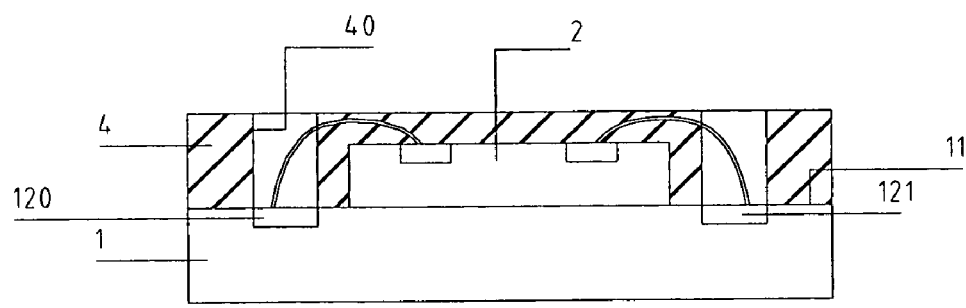
Figure 3:
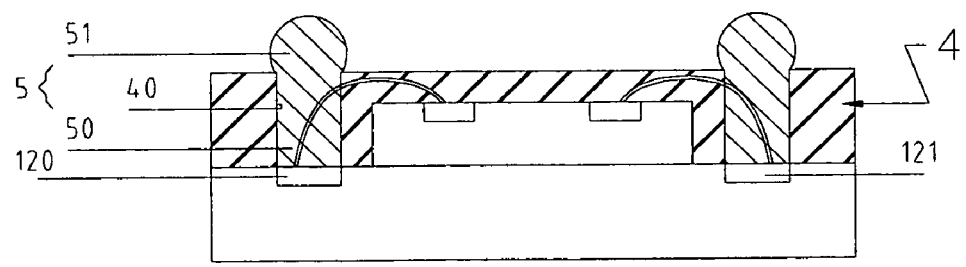

FIGS. 1 to 3 show three schematic, cross-sectional, flow-charts of a method for packaging an LED package structure according to the first best mold of the present invention, respectively.

Referring to FIG. 1, only one first LED chip 1 is disclosed in order to simplify the illustrations of FIGS. 1 to 3. The first LED chip 1 is triggered to generate light with light wavelength range between 450 nm to 470 nm. Actually, the first LED chip 1 has not cut from a LED wafer yet, and the first LED chip 1 is just an LED chip area of the LED wafer.

The first LED chip 1 has a major light-emitting surface 10, a minor light-emitting surface 11, a first electrode area 120 and a second electrode area 121. The minor light-emitting surface 11 is formed opposite to the major light-emitting surface 10. The first electrode area 120 with a first pole is arranged on one side of the minor light-emitting surface 11, and the second electrode area 121 with a second pole is arranged on opposite side of the minor light-emitting surface 11.

A second LED chip 2 is triggered to generate light with light wavelength range between 570 nm to 590 nm is provided. The second LED chip 2 has a size smaller than that of the first LED chip 1.

The second LED chip 2 has a major light-emitting surface 20, a minor light-emitting surface 21, a first electrode area 220 and a second electrode area 221. The minor light-emitting surface 21 is formed opposite to the major light-emitting surface 10. The first electrode area 220 with a first pole is arranged on one side of the minor light-emitting surface 21, and the second electrode area 221 with a second pole is arranged on opposite side of the minor light-emitting surface 21.

The major light-emitting surface 20 of the second LED chip 2 faces the minor light-emitting surface 11 of the first LED chip 1, and the second LED chip 2 is arranged on the minor light-emitting surface 11 of the first LED chip 1.

After the second LED chip 2 is arranged on the first LED chip 1, the first electrode area 120 and the second electrode area 121 of the first LED chip 1 are electrically connected with the first electrode area 220 and the second electrode area 221 of the second LED chip 2 via two conductive wires 3 by a wire bounding process, respectively. Moreover, the first pole of the first electrode area 120 is same as the first pole of the first electrode area 220, and the second pole of the second electrode area 121 is same as the second pole of the second electrode 221. In the present best mold, the wires 3 can be an electric conduction unit for electrically connecting with two poles.

Afterward, as shown in FIG. 2, an insulating layer 4 is formed on the minor light-emitting surface 11 of the first LED chip 1 and is covered completely on the second LED chip 2. The insulating layer 4 is made of any suitable photoresistant material.

The insulating layer 4 has a plurality of exposed holes 40 formed therein for exposing the first electrode area 120 and the second electrode area 121.

Referring to FIG. 3, an external electric conduction unit 5 is formed in each exposed hole 40 for electrically connecting with an external circuit (not shown). Each of the external electric conduction units 5 includes a first portion 50 for electrically connecting with the corresponding electrode area (120 or 121), and a second portion 51 electrically connected with the first portion 50 and projected outside the exposed hole 40.

The first portion 50 and the second portion 51 can be made of the same material or does not.

Moreover, the first LED chip 1 and the second LED chip 2 can be connected together in parallel or series.

The first LED chip 1 is triggered to generate light with light wavelength range between 450 nm to 470 nm, and the second LED chip 2 is triggered to generate light with light wavelength range between 570 nm to 590 nm. Hence, both the LED chips 1 and 2 can emit white light in the first best mold.

Figure 25:
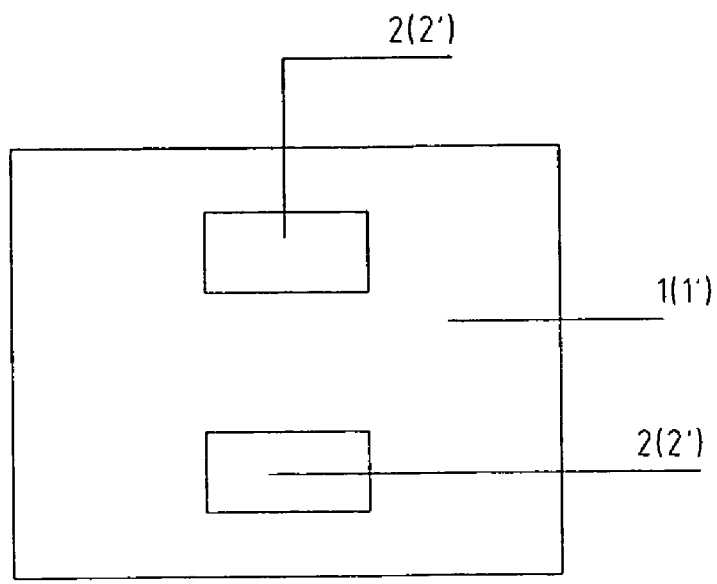
FIG. 25 is a schematic plane view for showing one best mold.

Furthermore, although only one second LED chip 2 is arranged on the first LED chip 1 as shown in FIG. 1, the number of the second LED chip 2 can be more than two according to user's need. For example, as shown in FIG. 25, two second LED chips 2 are arranged on the first LED chip 1. Need paying attention is that only first and second LED chips are shown in FIG. 25, and the others are lacked.

FIGS. 4 to 7 show four schematic, cross-sectional, flowcharts of a method for packaging LED chips according to the second best mold of the present invention, respectively.

Figure 4:
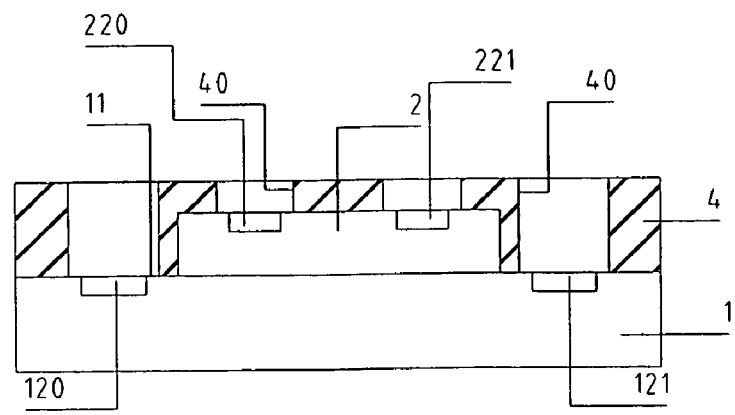
FIGS. 4 to 7 are four schematic, cross-sectional, flowcharts of a method for packaging an LED package structure according to the second best mold of the present invention, respectively.

Referring to FIG. 4, the same as the first best mold, a second LED chip 2 is arranged on a minor light-emitting surface 11 of a first LED chip 1 firstly.

Afterward, an insulating layer 4 is formed on the minor light-emitting surface 11 of the first LED chip 1 and is covered completely on the second LED chip 2. The insulating layer 4 has four exposed holes 40 are formed therein for exposing the electrode areas 120, 121, 220 and 221 respectively.

Figure 5:
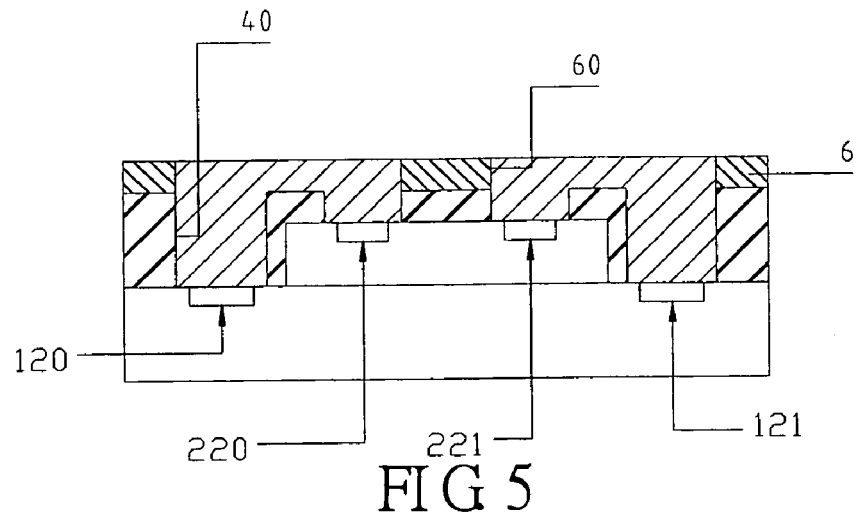

Such as to FIG. 5, after forming the exposed holes 40, a cover layer 6 is formed on the insulating layer 4 to define two communication holes 60. Hence, the electrode areas 120 and 220 are communicated to each other via one of communication hole 60, and the electrode areas 221 and 121 are communicated to each other via other communication hole 60.

Figure 6:
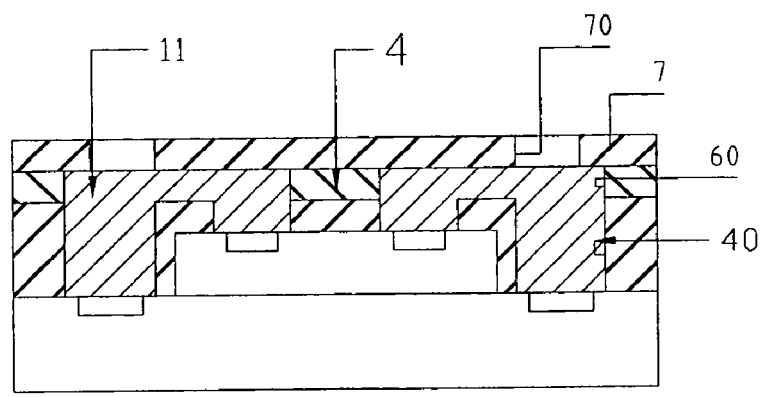

Such as FIG. 6, two conductive bodies 41 as an electric conduction unit are formed in each exposed hole 40 and communication hole 60 for electrically connecting the electrode areas 120 and 220, and electrode areas 221 and 121 respectively.

In the present invention, the conductive body 41 is formed by a printing method and is made of conductive material such as silver glue. However, the conductive body 41 can be made of another material and can be formed by another suit method such as a sputtering method. Moreover, an electroplating metal layer (not shown) such as nickel or gold material can be formed on the conductive bodies 41 according to user's needs.

Next, a protection layer 7 is formed on the cover layer 6, and the protection layer 7 has a plurality of through holes 70 formed therein for exposing a part of the corresponding conductive bodies 41.

Figure 7:
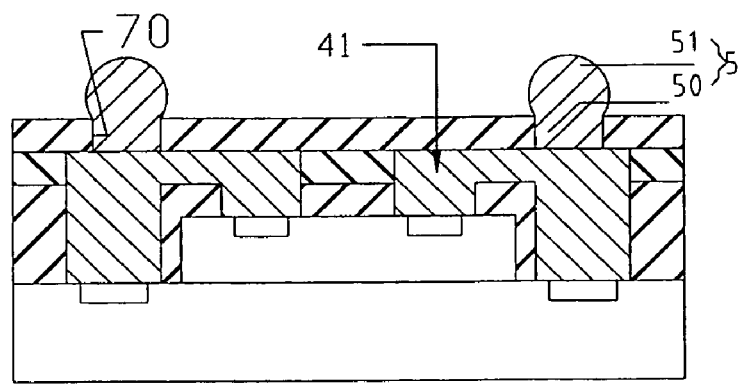

Such as FIG. 7, the same as the first best mold, an external electric conduction unit 5 with a first portion 50 and a second portion 51 is formed in each through hole 70.

Figure 8:
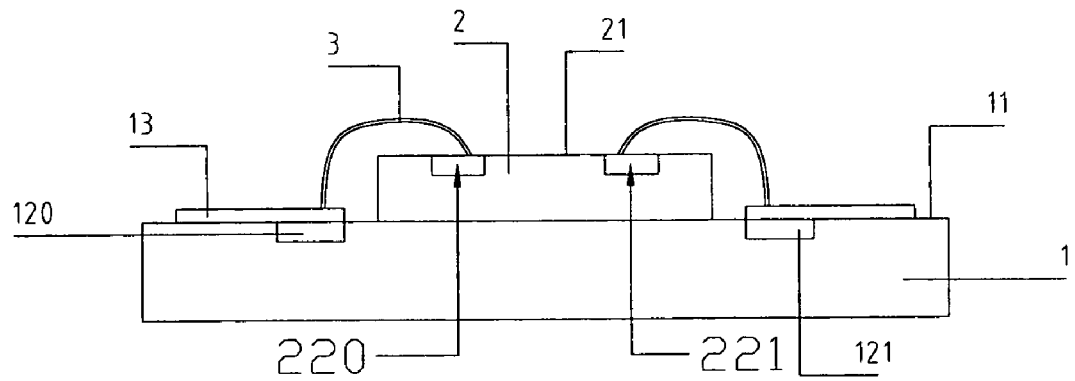
FIGS. 8 to 9 are two schematic, cross-sectional, flowcharts of a method for packaging an LED package structure according to the third best mold of the present invention, respectively.
Figure 9:
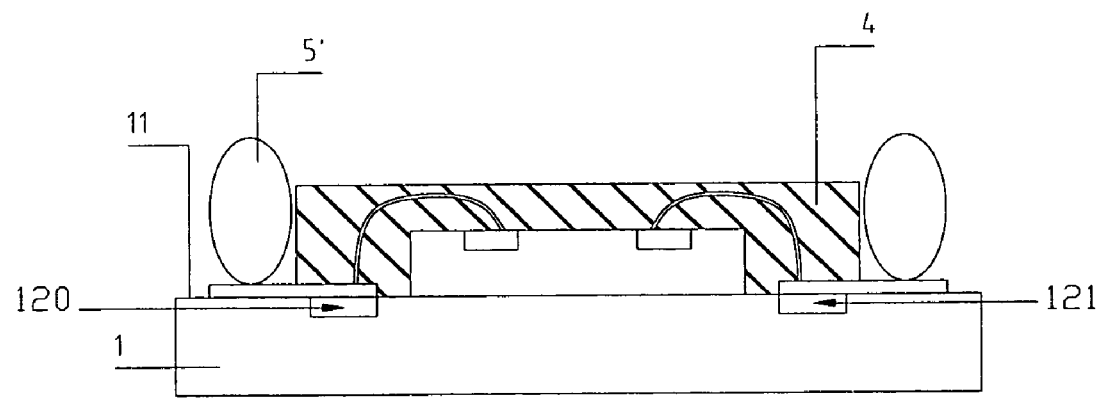

FIGS. 8 to 9 show two schematic, cross-sectional, flowcharts of a method for packaging an LED package structure according to the third best mold of the present invention, respectively.

Referring to FIG. 8, the same as the first best mold, a second LED chip 2 is arranged on a minor light-emitting surface 11 of a first LED chip 1 firstly. The electrode areas 120 and 121 of the first LED chip 1 are electrically connected with the electrode areas 220 and 221 of the second LED chip 2 via two wires 3 by a wire bounding process, respectively.

The difference between the third best mold and the first best mold is that the third best mold provides two conductive metal blocks 13 formed on the minor light-emitting surface 11 of the first LED chip 1. Each of the conductive metal blocks 13 has a first end side extended to the corresponding electrode area 120 or 121, and a second end side being extended far away from the corresponding electrode area 120 or 121.

Referring to FIG. 9, an insulating layer 4 is covered completely on the second LED chip 2, a part of the minor light-emitting surface 11 of the first LED chip 1, and a part of the first end side of each conductive metal block 13.

Afterward, an external electric conduction unit 5' is formed on a part of the second end side of each conductive metal block 13 for electrically connecting with an external circuit (not shown).

Figure 10:
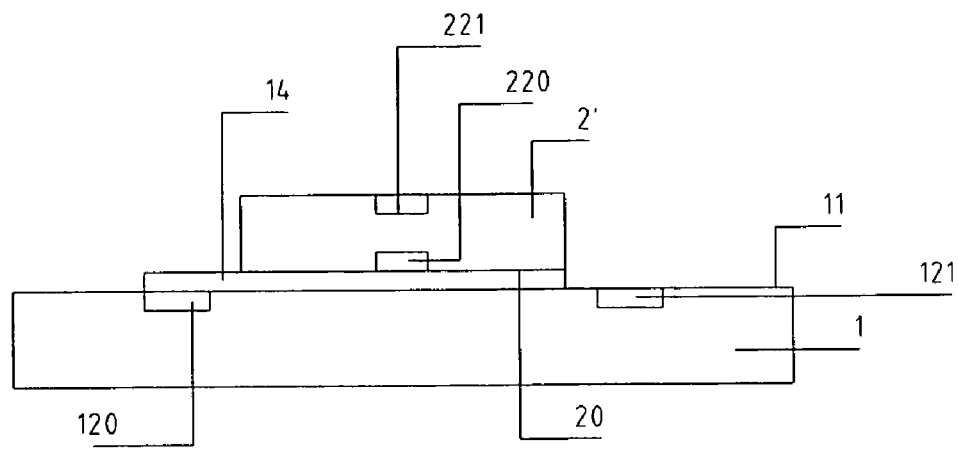
FIGS. 10 to 11 are two schematic, cross-sectional, flowcharts of a method for packaging an LED package structure according to the fourth best mold of the present invention, respectively.
Figure 11:
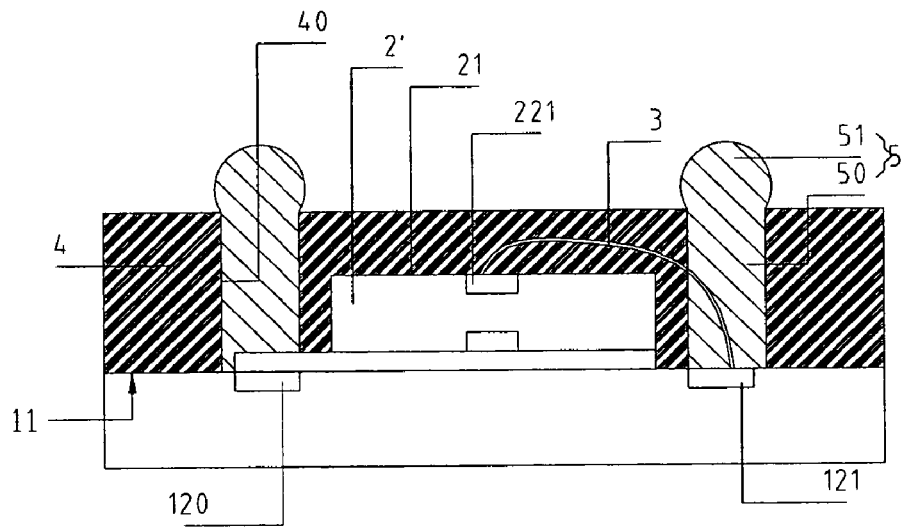

FIGS. 10 to 11 show two schematic, cross-sectional, flowcharts of a method for packaging an LED package structure according to the fourth best mold of the present invention, respectively.

Referring to FIG. 10, a first LED chip 1 is provided firstly. A conductive metal layer 14 is formed on a minor light-emitting surface 11 of the first LED chip 1. The conductive metal layer 14 has a first end side extended to a first electrode area 120 of the first LED chip, and a second end side facing to the second electrode area 121.

Next, a second LED chip 2 is provided. The fourth best mold differed from other best molds is that a second LED chip 2' has a first electrode area 220 formed on a major light-emitting surface 20 thereof.

The second LED chip 2' is arranged on the minor light-emitting surface 11 of the first LED chip 1, and lets the major light-emitting surface 20 face the minor light-emitting surface 11. Hence the first electrode area 220 contacts electrically with the second end side of the conductive metal layer 14.

Afterwards, referring to FIG. 11, the second LED chip 2' has a second electrode area 221 formed on a minor light-emitting surface 21 thereof, and the second electrode area 221 of the second LED chip 2' contacts electrically with the second electrode area 121 of the first LED chip 1 through a conductive wire 3, In this best mold, the conductive metal layer 14 and the conductive wire 3 cooperate to each other to be an electric conduction unit.

Next, an insulating layer 4 is formed on the minor light-emitting surface 11 of the first LED chip 1, and is covered completely on the second LED chip 2'. The insulating layer 4 has a plurality of exposed holes 40 formed therein for exposing the first electrode area 120 and the second electrode 121. The same as the first best mold, an external electric conduction unit 5 is formed in each exposed hole 40, and each of the external electric conduction units 5 includes a first portion 50 and a second portion 51.

Figure 12:
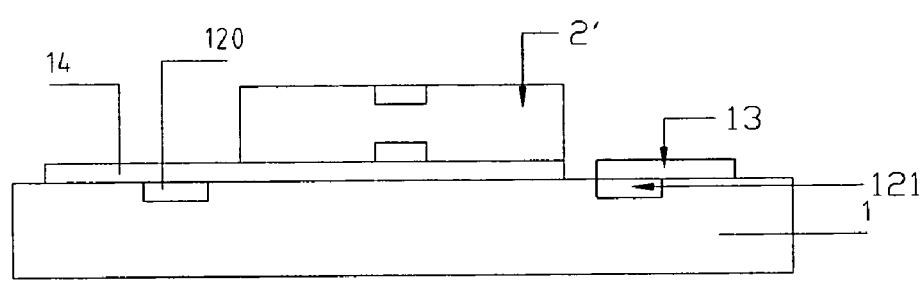
FIGS. 12 to 13 are two schematic, cross-sectional, flowcharts of a method for packaging an LED package structure according to the fifth best mold of the present invention, respectively.
Figure 13:
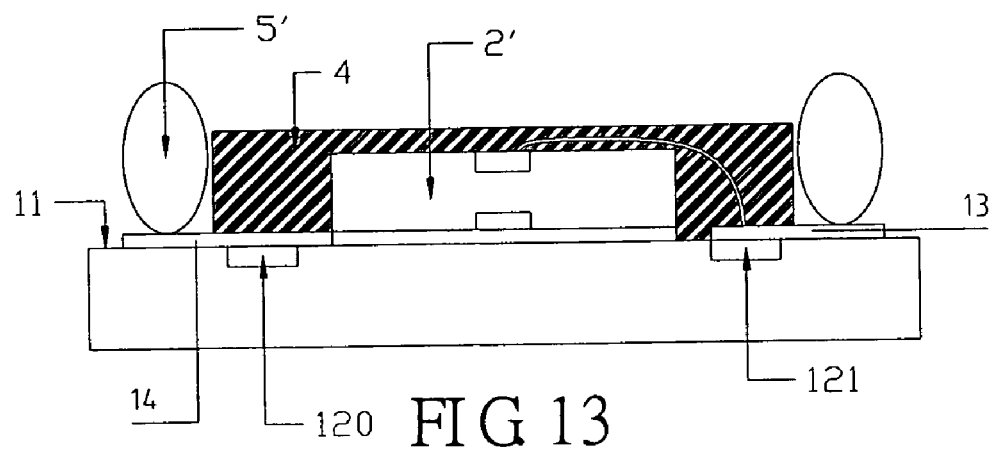

FIGS. 12 to 13 show two schematic, cross-sectional, flowcharts of a method for packaging an LED package structure according to the fifth best mold of the present invention, respectively.

Referring to FIG. 12, the same as the fourth best mold, a second LED chip 2' is arranged on a first LED chip 1. The fifth best mold differed from the fourth best molds is that a first end side of the conductive metal layer 14 is extended to surrounding of a first electrode area 120, and a metal contact point 13 is formed on a minor light-emitting surface 11 of the first LED chip 1. The metal contact point 13 has a first end side extended to a second electrode area 121 and a second end side being extended far away from the second electrode area 121.

Moreover, referring to FIG. 13, an insulating layer 4 is formed on a part of the minor light-emitting surface 11 of the first LED chip 1, and is formed above the first electrode area 120 and the second electrode area 121 for covering a part of the first end side of the conductive metal layer 14 and a part of a first end side of the metal contact point 13.

Moreover, two external electric conduction units 5' are respectively formed on a part of the second end side of the conductive metal layer 14 and a part of the second end side of the metal contact point 13 for electrically connecting with an external circuit (not shown).

FIGS. 14 to 17 show four schematic, cross-sectional, flowcharts of a method for packaging an LED package structure according to the sixth best mold of the present invention, respectively.

Figure 14:
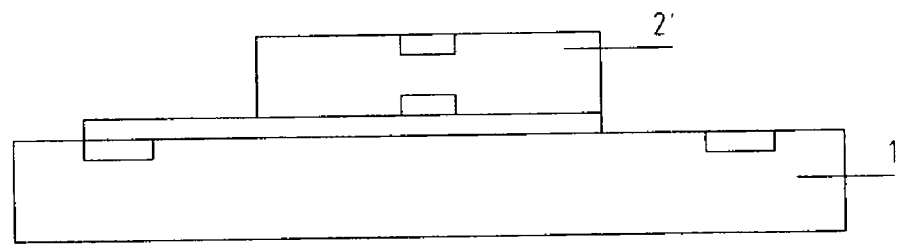
FIGS. 14 to 17 are four schematic, cross-sectional, flow-charts of a method for packaging an LED package structure according to the sixth best mold of the present invention, respectively.
Figure 15:
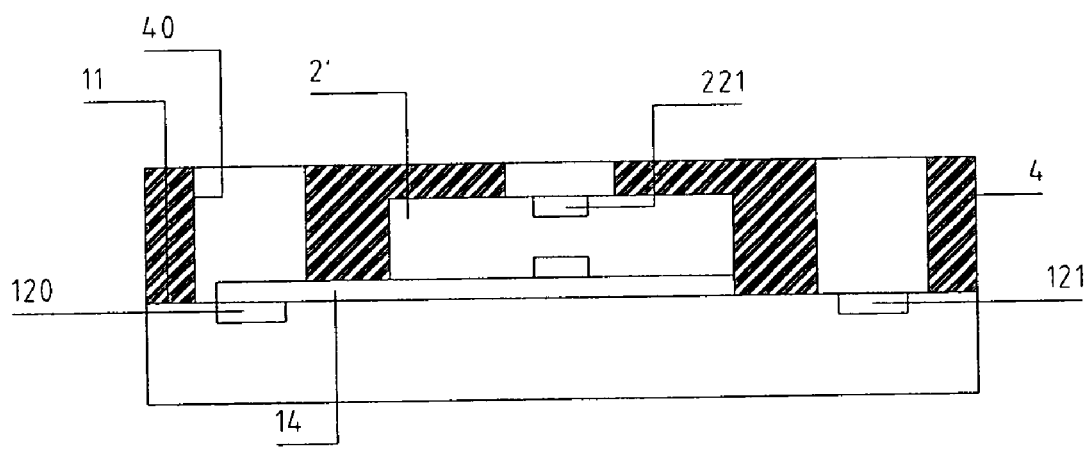

Referring to FIG. 14, the same as the fourth best mold, a second LED chip 2' is arranged on a first LED chip 1.

Afterward, an insulating layer 4 is formed on the minor light-emitting surface 11 of the first LED chip 1 and is covered completely on the second LED chip 2'. The insulating layer 4 has three exposed holes 40 are formed therein for exposing the electrode areas 120, 121 and 221 respectively.

Figure 16:
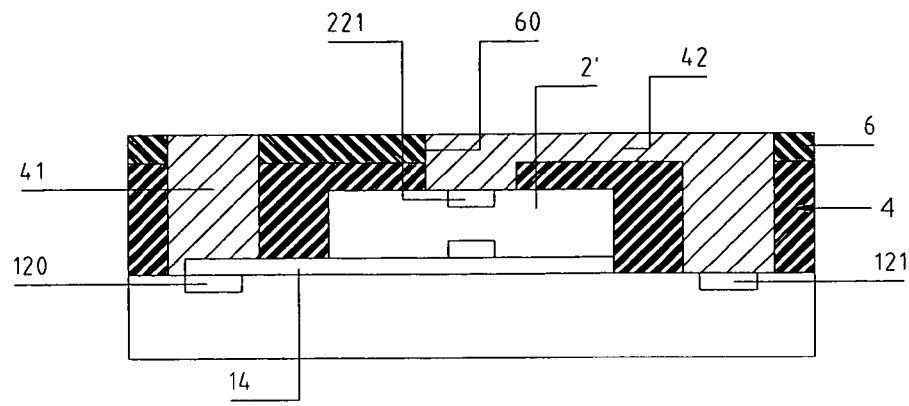

Referring to FIG. 16, a cover layer 6 is formed on the insulating layer 4 to form two communication holes 60. Both the exposed hole 40 for exposing the second electrode area 121 of the first LED chip 1 and the exposed hole 40 for exposing the second electrode area 221 of the second LED chip 2' are communicated with one of the communication holes 60. Moreover the exposed hole 40 for exposing the first electrode area 120 of the first LED chip 1 is communicated with the other communication hole 60.

After forming the communication holes 60, a conductive body 41 is formed in each communication hole 60 and each exposed hole 40.

Figure 17:
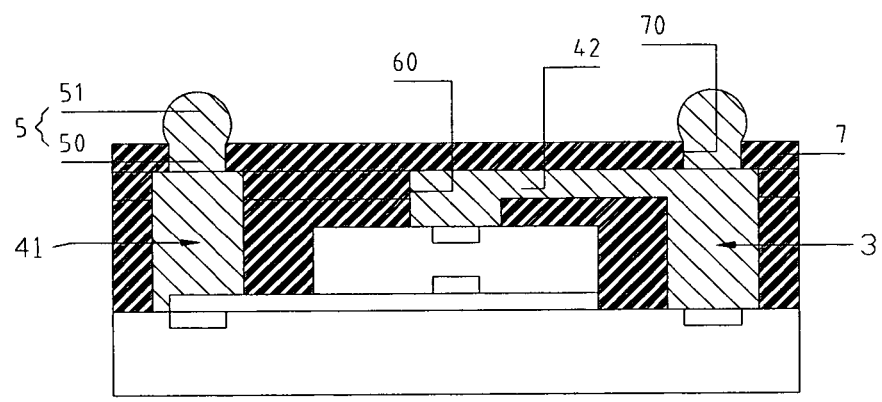

As shown in FIG. 17, a protection layer 7 is formed on the cover layer 6, and it is formed on the conductive body 41 to form a plurality of communication holes 70 for exposing a part of the corresponding conductive bodies 41.

Next, the same as first best mold, an external electric conduction unit 5 includes a first portion 50 formed in each communication hole 70 and a second portion 51 projected outside each communication hole 70.

Figure 18:
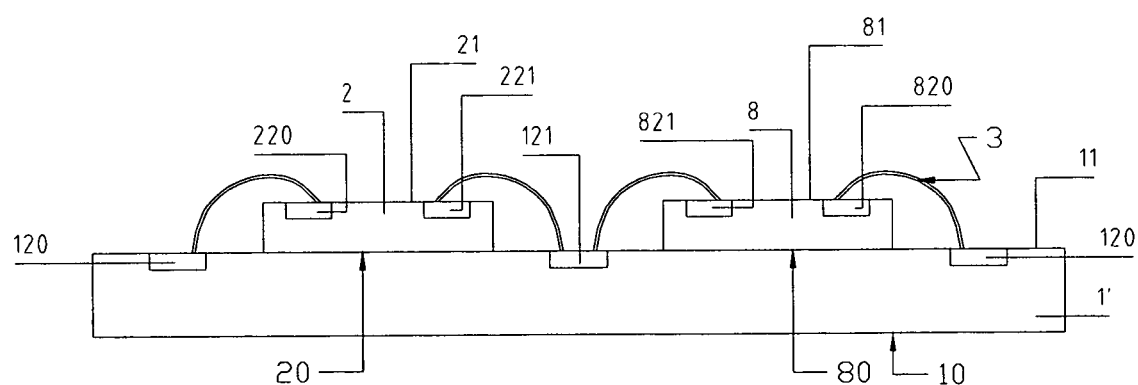
FIGS. 18 to 20 are three schematic, cross-sectional, flow-charts of a method for packaging an LED package structure according to the seventh best mold of the present invention, respectively.
Figure 19:
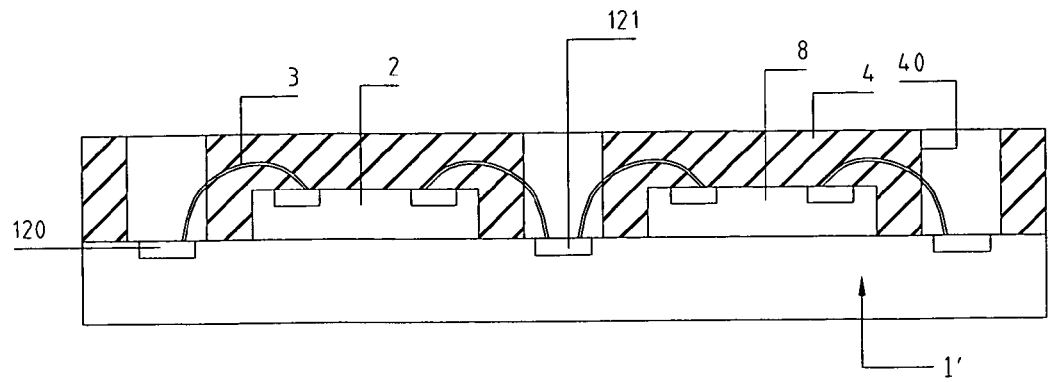
Figure 20:
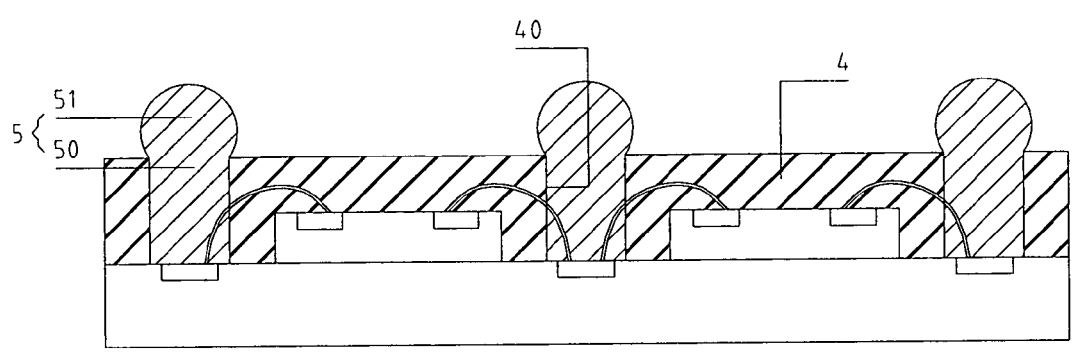

FIGS. 18 to 20 show three schematic, cross-sectional, flowcharts of a method for packaging an LED package structure according to the seventh best mold of the present invention, respectively.

Referring to FIG. 18, a first LED chip 1' is triggered to generate light with light wavelength range between 450 nm to 470 nm. The first LED chip 1' has a major light-emitting surface 10, a minor light-emitting surface 11, at least two first electrode areas 120 and at least one second electrode area 121. The minor light-emitting surface 11 is formed opposite to the major light-emitting surface 10. The at least two first electrode areas 120 with a first pole is arranged on one side of the minor light-emitting surface 11, and the second electrode area 121 with a second pole is arranged on opposite side of the minor light-emitting surface 11. Moreover, the number of the first electrode areas 120 and the second electrode area 121 can be inverted.

Furthermore, a second LED chip 2 is triggered to generate light with light wavelength range between 520 nm to 540 nm. The second LED chip 2 has a major light-emitting surface 20, a minor light-emitting surface 21, at least one first electrode area 220 and at least one second electrode area 221. The minor light-emitting surface 21 is formed opposite to the major light-emitting surface 10. The first electrode area 220 with a first pole is arranged on one side of the minor light-emitting surface 21, and the second electrode area 221 with a second pole is arranged on opposite side of the minor light-emitting surface 21.

In addition, a third LED 8 chip is triggered to generate light with light wavelength range between 610 nm to 630 nm. The third LED chip 8 has a major light-emitting surface 80, a minor light-emitting surface 81, at least one first electrode area 820 and at least one second electrode area 821. The minor light-emitting surface 81 is formed opposite to the major light-emitting surface 80. The first electrode area 820 with a first pole is arranged on one side of the minor light-emitting surface 81, and the second electrode area 821 with a second pole is arranged on opposite side of the minor light-emitting surface 81.

The major light-emitting surface 20 of the second LED chip 2 faces the minor light-emitting surface 11 of the first LED chip 1', and the second LED chip 2 is arranged on the minor light-emitting surface 11 of the first LED chip 1'. Moreover, the major light-emitting surface 80 of the second LED chip 8 faces the minor light-emitting surface 11 of the first LED chip 1', and the second LED chip 8 is arranged on the minor light-emitting surface 11 of the first LED chip 1'.

After both the second LED chip 2 and the third LED chip 8 are arranged on the first LED chip 1', the two first electrode area 120 of the first LED chip 1' are electrically connected with the first electrode area 220 of the second LED chip 2 and the first electrode area 820 of the third LED chip 8 via two conductive wires 3 by a wire bounding process, respectively. Moreover, the second electrode area 121 of the first LED chip 1' is electrically connected with both the second electrode area 221 of the second LED chip 2 and the second electrode area 821 of the third LED chip 8 via two conductive wires 3 by a wire bounding process, respectively.

Afterward, as shown in FIG. 19, an insulating layer 4 is formed on the minor light-emitting surface 11 of the first LED chip 1' and is covered completely on the second LED chip 2 and the third LED chip 8. The insulating layer 4 has a plurality of exposed holes 40 formed therein for exposing the first electrode area 120 and the second electrode area 121 of the first LED chip 1'.

Referring to FIG. 20, the same as the first best mold, an external electric conduction unit 5 with a first portion 50 and a second portion 51 is formed in each exposed hole 40.

In the seventh best mold, the first LED chip 1' is triggered to generate light with light wavelength range between 450 nm to 470 nm, the second LED chip 2 is triggered to generate light with light wavelength range between 520 nm to 540 nm and the third LED 8 chip is triggered to generate light with light wavelength range between 610 nm to 630 nm, so that the LED package structure of the seventh best mold can generate white light.

Figure 21:
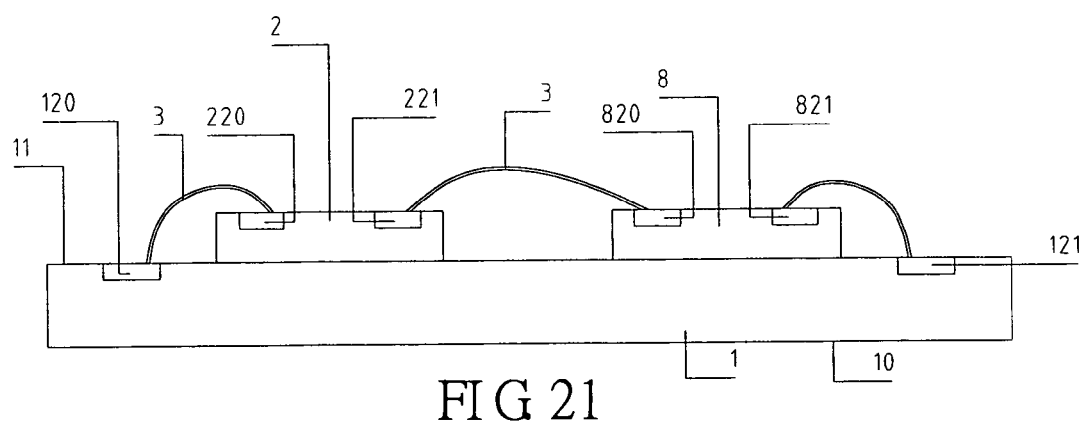
FIGS. 21 to 23 are three schematic, cross-sectional, flow-charts of a method for packaging an LED package structure according to the eighth best mold of the present invention, respectively.
Figure 22:
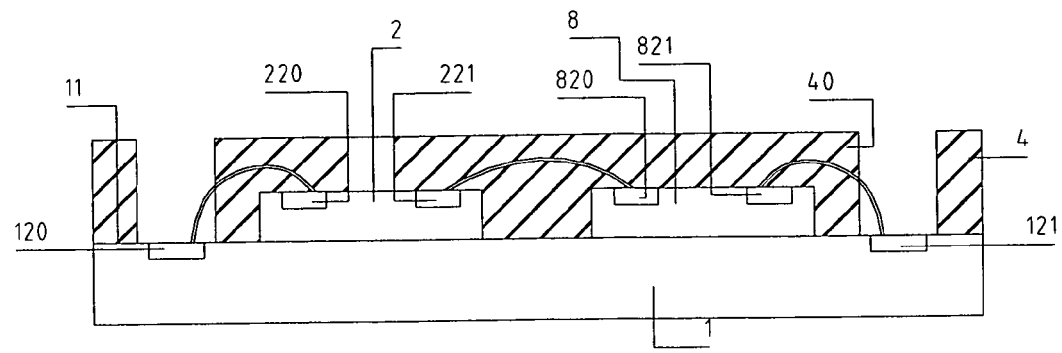
Figure 23:
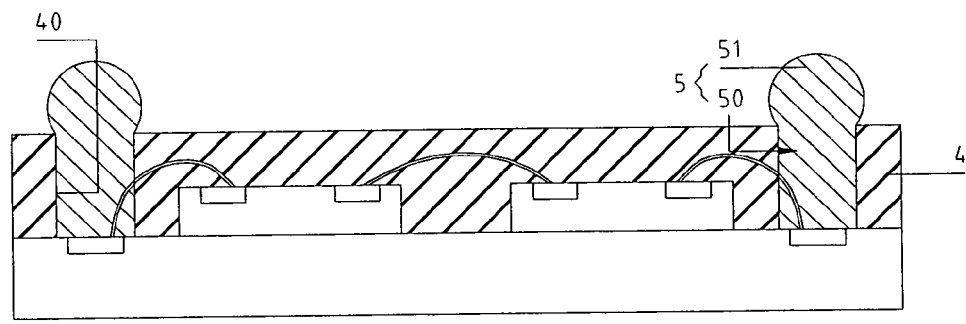

FIGS. 21 to 23 show three schematic, cross-sectional, flowcharts of a method for packaging an LED package structure according to the eighth best mold of the present invention, respectively.

Referring to FIG. 21, a first LED chip 1 is provided. The first LED chip 1 has a major light-emitting surface 10, a minor light-emitting surface 11, at least two first electrode areas 120 and at least one second electrode area 121. The minor light-emitting surface 11 is formed opposite to the major light-emitting surface 10. The at least two first electrode areas 120 with a first pole is arranged on one side of the minor light-emitting surface 11, and the second electrode area 121 with a second pole is arranged on opposite side of the minor light-emitting surface 11.

Furthermore, the same as the seventh best mold, both a second LED chip 2 and a third LED chip 8 are arranged on the minor light-emitting surface 11 of the first LED chip 1 by the method of the seventh best mold.

After both the second LED chip 2 and the third LED chip 8 are arranged on the first LED chip 1, the first electrode area 120 and the second electrode area 121 of the first LED chip 1 are electrically connected with the first electrode area 220 of the second LED chip 2 and the second electrode area 821 of the third LED chip 8 via two conductive wires 3 by a wire bounding process, respectively. Moreover, the second electrode area 221 of the second LED chip 2 is electrically connected with the first electrode area 820 of the third LED chip 8 via a conductive wire 3 by a wire bounding process.

Afterward, as shown in FIG. 22, an insulating layer 4 is formed on the minor light-emitting surface 11 of the first LED chip 1 and is covered completely on the second LED chip 2 and the third LED chip 8. The insulating layer 4 has a plurality of exposed holes 40 formed therein for exposing the first electrode area 120 and the second electrode area 121 of the first LED chip 1.

Referring to FIG. 23, the same as the first best mold, an external electric conduction unit 5 with a first portion 50 and a second portion 51 is formed in each exposed hole 40.

Figure 24:
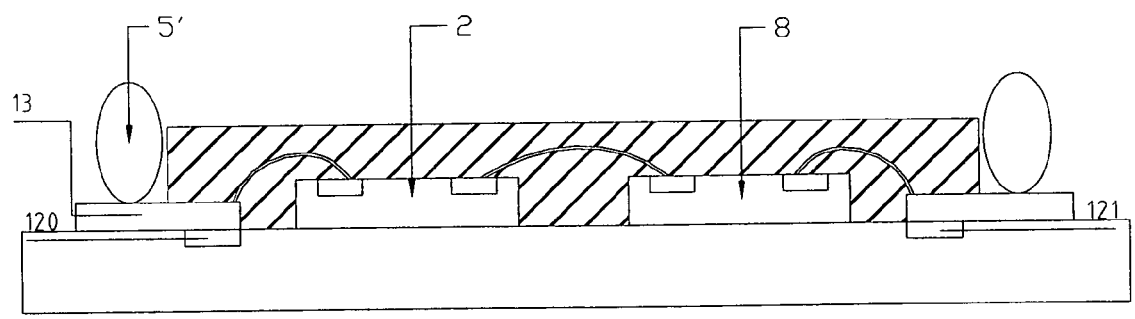
FIG. 24 is a schematic, cross-sectional view of a LED package structure according to the ninth best mold of the present invention.

FIG. 24 shows a schematic, cross-sectional view of a LED package structure according to the ninth best mold of the present invention.

Referring to FIG. 24, the difference between the ninth best mold and the eighth best mold is that the ninth best mold provides two conductive metal blocks 13 formed on the minor light-emitting surface 11 of the first LED chip 1. Each of the conductive metal blocks 13 has a first end side extended to the corresponding electrode area 120 or 121, and a second end side being extended far away from the corresponding electrode area 120 or 121.

Moreover, an insulating layer 4 is covered completely on the second LED chip 2 and the third LED chip 8, a part of the minor light-emitting surface 11 of the first LED chip 1, and a part of the first end side of each conductive metal block 13.

Afterward, an external electric conduction unit 5' is formed on a part of the second end side of each conductive metal block 13 for electrically connecting with an external circuit (not shown).

Figure 27:
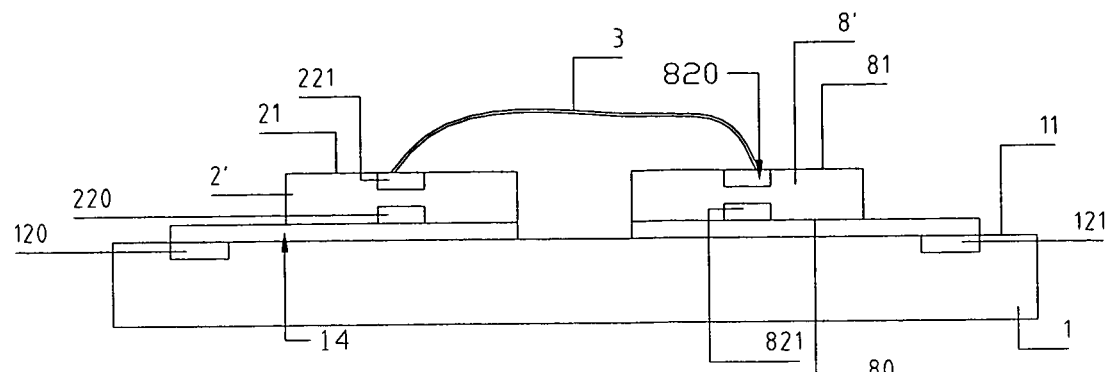
FIGS. 27 to 29 are three schematic, cross-sectional, flow-charts of a method for packaging an LED package structure according to the tenth best mold of the present invention, respectively.
Figure 28:
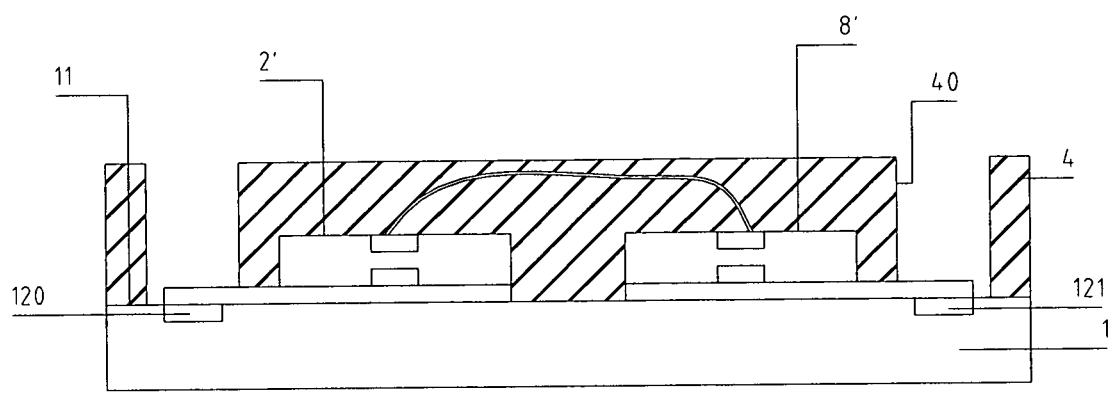
Figure 29:
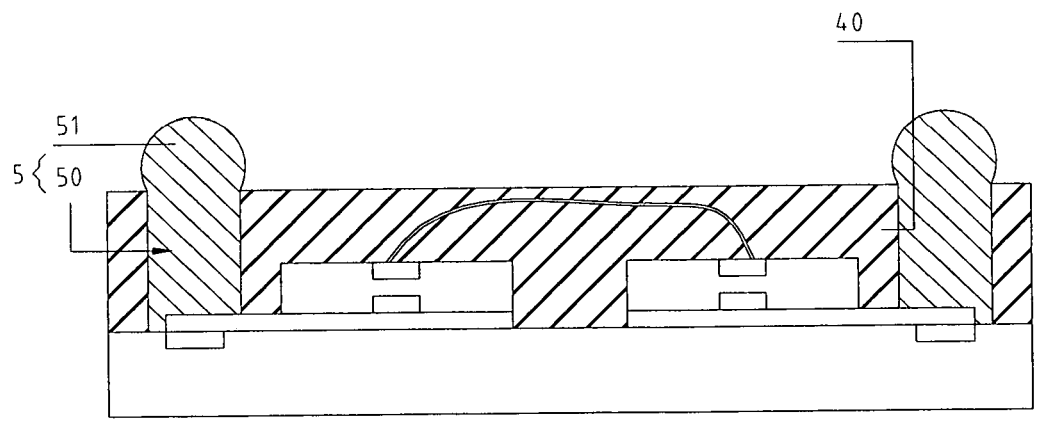

FIGS. 27 to 29 show three schematic, cross-sectional, flowcharts of a method for packaging an LED package structure according to the tenth best mold of the present invention, respectively.

Referring to FIG. 27, the same as the ninth best mold, a first LED chip 1 is provided firstly. Two conductive metal layers 14 are formed on a minor light-emitting surface 11 of the first LED chip 1 respectively. The two conductive metal layers 14 have two first end sides extended to a first electrode area 120 and a second electrode area 121 respectively, and two second end sides being inwardly extended far away from the first electrode area 120 and the second electrode area 121 respectively.

Next, a second LED chip 2' and a third LED chip 8' are provided. The second LED chip 2' has a major light-emitting surface 20, a minor light-emitting surface 21 opposite to the major light-emitting surface 20, a first electrode area 220 formed on the major light-emitting surface 20, and a second electrode area 121 formed on the minor light-emitting surface 21. Moreover, The third LED chip 8' has a major light-emitting surface 80, a minor light-emitting surface 81 opposite to the major light-emitting surface 80, a first electrode area 820 formed on the major light-emitting surface 80, and a second electrode area 821 formed on the minor light-emitting surface 81.

Both the second LED chip 2' and the third LED chip 8' are arranged on the minor light-emitting surface 11 of the first LED chip 1, and lets both the major light-emitting surface 20 and the major light-emitting surface 80 face the minor light-emitting surface 11. Hence both the first electrode area 220 and the first electrode area 820 contact electrically with the second end side of the conductive metal layer 14. Afterward, the second electrode area 121 of the first LED chip 1 is electrically connected with the second electrode area 821 of the third LED chip 8' through a conductive wire 3, In this best mold, the conductive metal layer 14 and the conductive wire 3 cooperate to each other to be an electric conduction unit.

As shown in FIG. 28, an insulating layer 4 is formed on the minor light-emitting surface 11 of the first LED chip 1, and is covered completely on the second LED chip 2' and the third LED chip 8'. The insulating layer 4 has a plurality of exposed holes 40 formed therein for exposing the first electrode area 120 and the second electrode area 121.

As shown in FIG. 29, the same as the first best mold, an external electric conduction unit 5 is formed in each exposed hole 40, and each of the external electric conduction units 5 includes a first portion 50 and a second portion 51.

Figure 30:
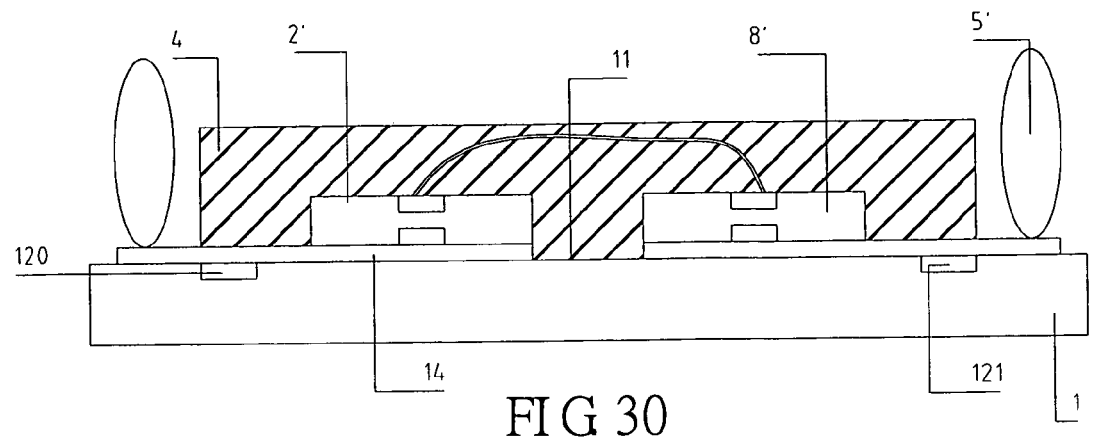
FIG. 30 is a schematic, cross-sectional view of a LED package structure according to the eleventh best mold of the present invention.

FIG. 30 shows a schematic, cross-sectional view of a LED package structure according to the eleventh best mold of the present invention.

Referring to FIG. 30, the eleventh best mold differed from the tenth best molds is that a first end side of the conductive metal layer 14 is extended to surroundings of a first electrode area 120 and a second electrode area 121. Moreover, an insulating layer 4 is formed on a part of the minor light-emitting surface 11 of the first LED chip 1, and is formed above the first electrode area 120 and the second electrode area 121 for covering a part of the conductive metal layer 14 and a part of the metal contact point 13.

Moreover, two external electric conduction units 5' are respectively formed on a part of the second end side of the conductive metal layer 14 and a part of the second end side of the metal contact point 13 for electrically connecting with an external circuit (not shown).

Figure 31:
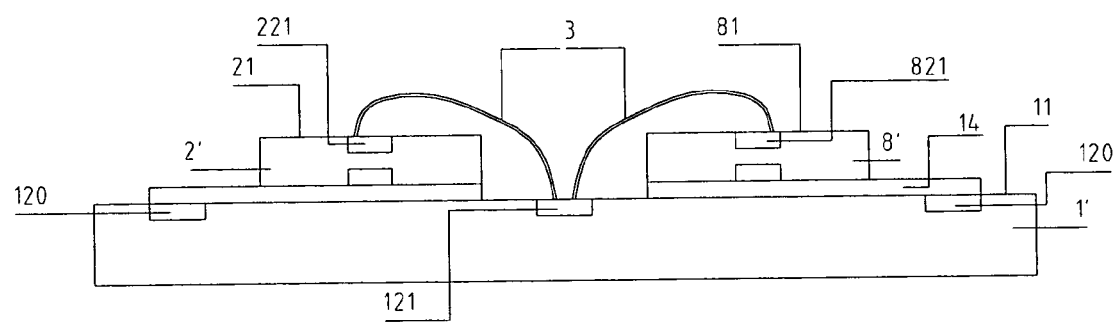
FIGS. 31 to 33 are three schematic, cross-sectional, flow-charts of a method for packaging an LED package structure according to the twelfth best mold of the present invention, respectively.
Figure 32:
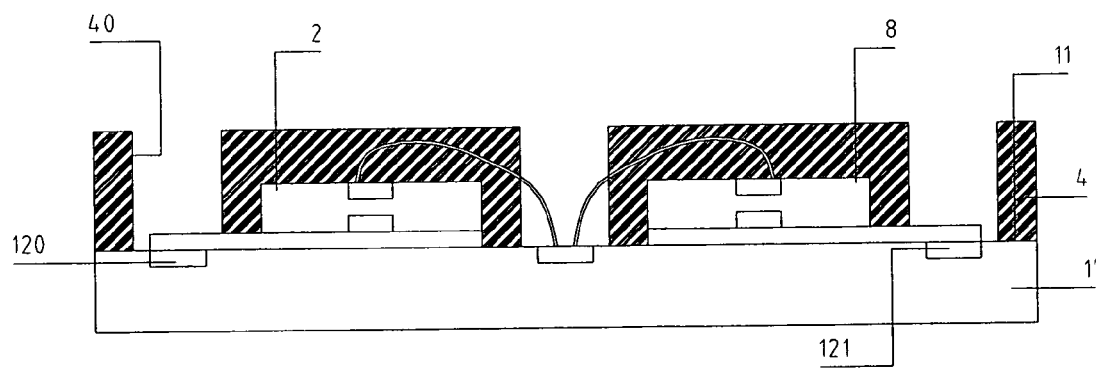
Figure 33:
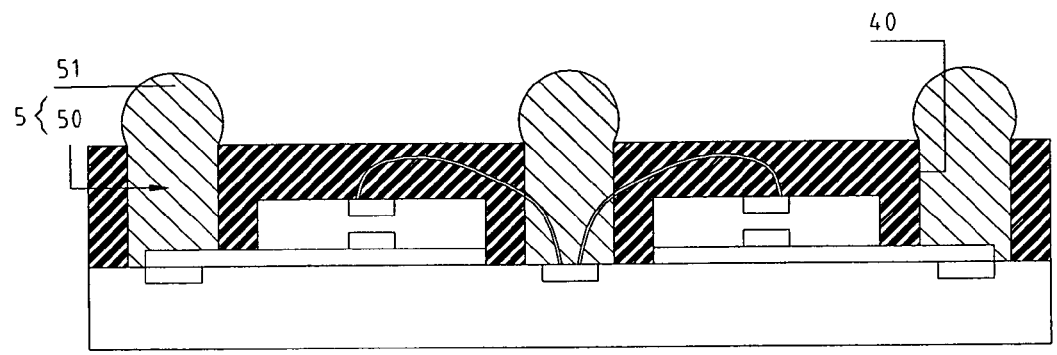

FIGS. 31 to 33 show three schematic, cross-sectional, flowcharts of a method for packaging an LED package structure according to the twelfth best mold of the present invention, respectively.

Referring to FIG. 31, the same as the seventh best mold, a first LED chip 1' is provided firstly. Two conductive metal layers 14 are formed on a minor light-emitting surface 11 of the first LED chip 1' respectively. The two conductive metal layers 14 have two first end sides extended to a first electrode area 120 and a second electrode area 121 respectively, and two second end sides being inwardly extended far away from the first electrode area 120 and the second electrode area 121 respectively.

Next, the same as the eleventh best mold, a second LED chip 2' and a third LED chip 8' are provided. Both a second electrode area 121 of the second LED chip 2' and a second electrode area 821 of the third LED chip 8' are electrically connected with a second electrode area 121 of the first LED chip 1' through a conductive wire 3, In this best mold, the conductive metal layer 14 and the conductive wire 3 cooperate to each other to be an electric conduction unit.

As shown in FIG. 32, an insulating layer 4 is formed on the minor light-emitting surface 11 of the first LED chip 1, and is covered completely on the second LED chip 2' and the third LED chip 8'. The insulating layer 4 has a plurality of exposed holes 40 formed therein for exposing the first electrode area 120 and the second electrode area 121.

As shown in FIG. 33, the same as the first best mold, an external electric conduction unit 5 is formed in each exposed hole 40, and each of the external electric conduction units 5 includes a first portion 50 and a second portion 51.

Figure 26:
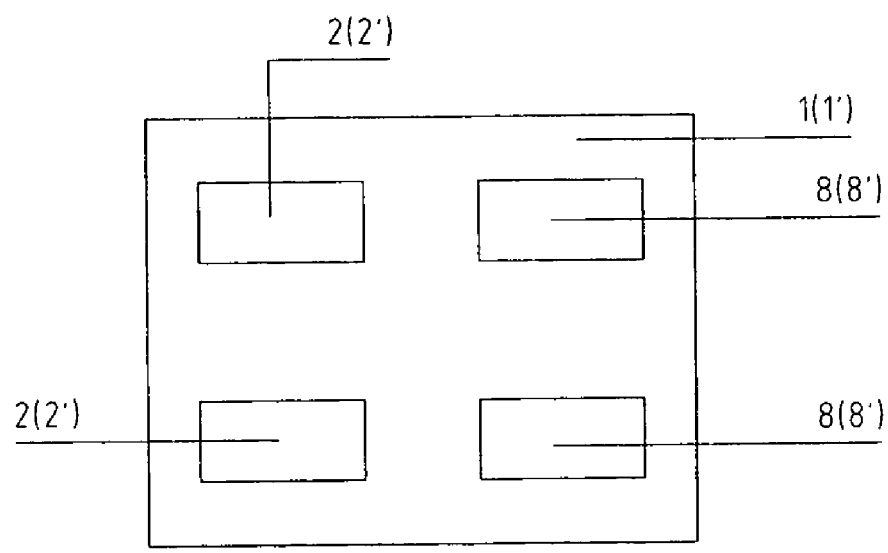
FIG. 26 is a schematic plane view for showing another best mold.

Although only one second LED chip 2 (2') and one third LED chip 8(8') are shown in above-mentioned figures, more second LED chips 2(2') and third LED chips 8(8') can be provided according user's needs such as top schematic view of FIG. 26.

Figure 34:
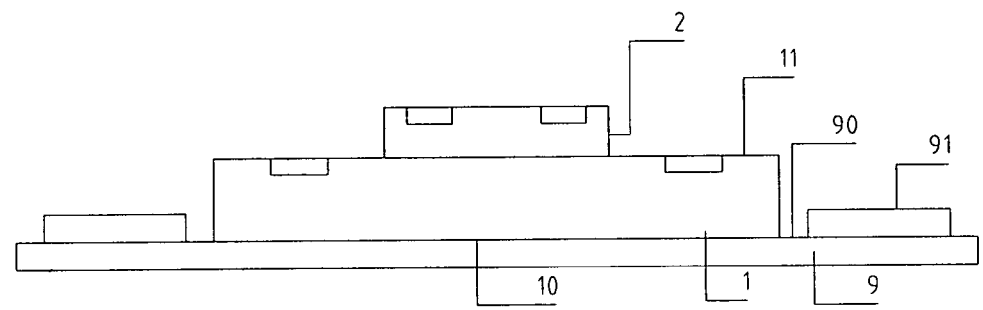
FIGS. 34 to 36 are three schematic, cross-sectional, flow-charts of a method for packaging an LED package structure according to the thirteenth best mold of the present invention, respectively.
Figure 35:
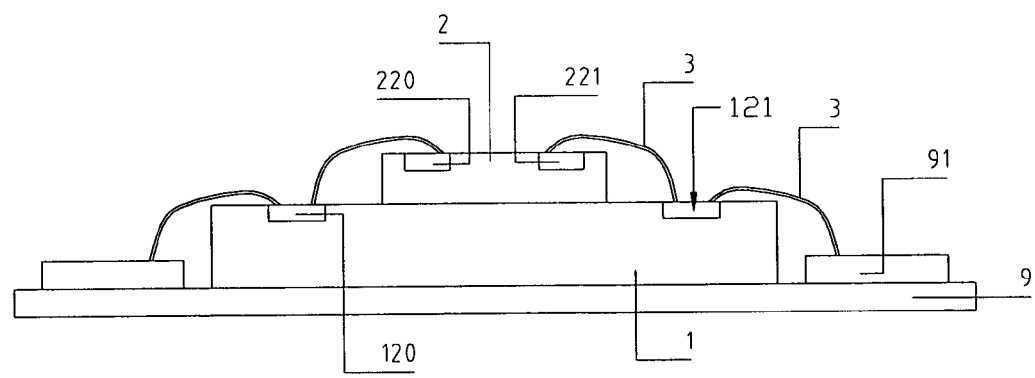
Figure 36:
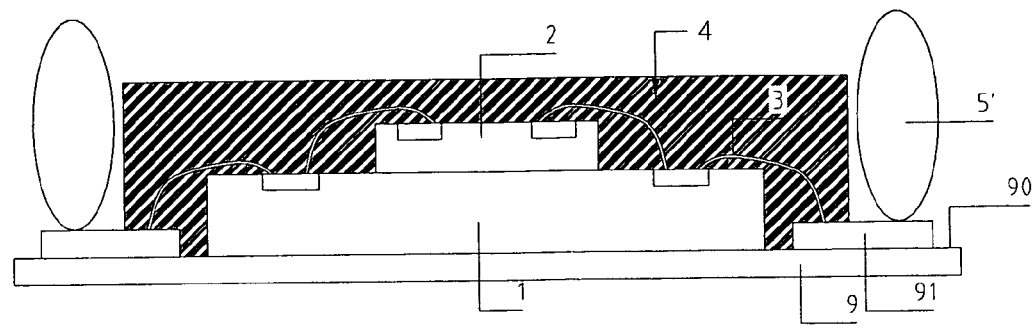

FIGS. 34 to 36 show three schematic, cross-sectional, flowcharts of a method for packaging an LED package structure according to the thirteenth best mold of the present invention, respectively.

Referring to FIG. 34, a transparent substrate 9 is provided. The substrate 9 can be made of any transparent materials. The substrate 9 has an installed surface 90 and at least two conductive points 91 formed on the installed surface 90.

Moreover, the same as the first best mold, a first LED chip 1 is arranged on the installed surface 90 of the substrate 9, lets a major light-emitting surface 10 of the first LED chip 1 face the installed surface 90. A second LED chip 2 is arranged on a minor light-emitting surface 11 of the first LED chip 1.

Referring to FIG. 35, the first LED chip 1 has a first electrode area 120 and a second electrode area 121 electrically connected with the corresponding two conductive points 91 through two conductive wires 3 respectively. The second LED chip 2 has a first electrode area 220 and a second electrode area 221 electrically connected with the first electrode area 120 and the second electrode area 121 through another two conductive wires 3 respectively.

Afterward, referring to FIG. 36, an insulating layer 4 is formed on a part of the installed surface 90 and a part of the conductive point 91, and is covered completely on the first LED chip 1 and the second LED chip 2.

Next, an external electric conduction unit 5' is formed on the other part (without being covered by the insulating layer 4) of each conductive point 91 for electrically connecting with an external circuit (not shown).

Figure 37:
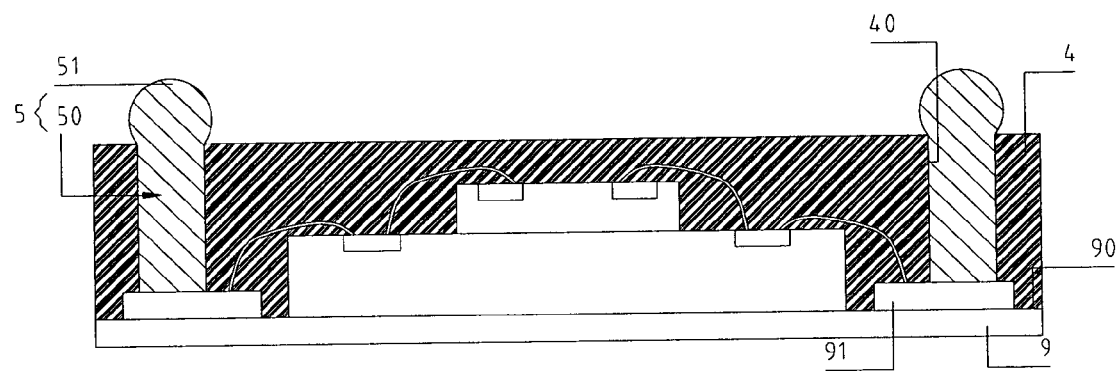
FIG. 37 is a schematic, cross-sectional view of a LED package structure according to the fourteenth best mold of the present invention.

FIG. 37 shows a schematic, cross-sectional view of a LED package structure according to the fourteenth best mold of the present invention.

The fourteenth best mold differed from the thirteenth best mold is that the insulating layer 4 is formed on a part of the installed surface 90 and above the installed surface 90 for completely covering the conductive points 91, the first LED chip 1 and the second LED chip 2. Afterward, the same as the first best mold, an external electric conduction unit 5 is formed in each exposed hole 40, and each of the external electric conduction units 5 includes a first portion 50 and a second portion 51.

As shown in FIG. 33, the same as the first best mold, an external electric conduction unit 5 is formed in each exposed hole 40, and each of the external electric conduction units 5 includes a first portion 50 and a second portion 51.

Figure 38:
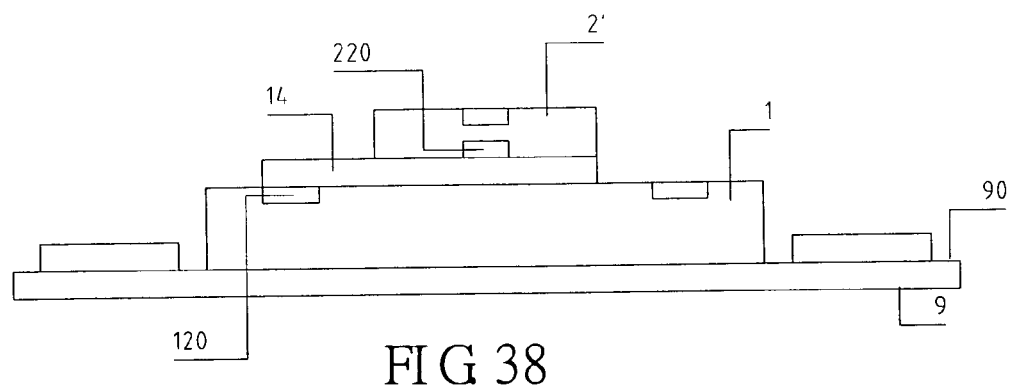
FIGS. 38 to 40 are three schematic, cross-sectional, flow-charts of a method for packaging an LED package structure according to the fifteenth best mold of the present invention, respectively.
Figure 39:
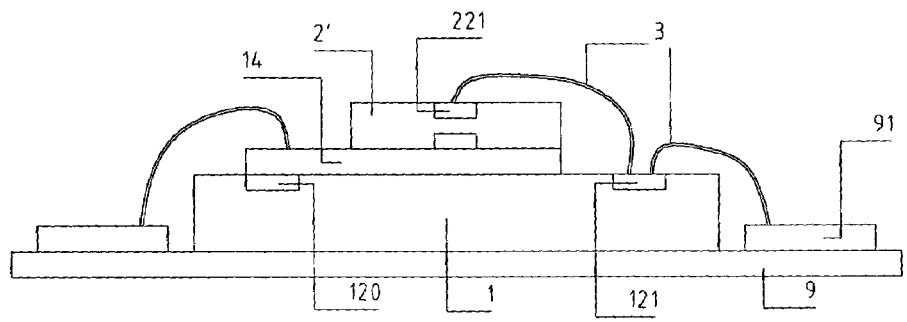
Figure 40:
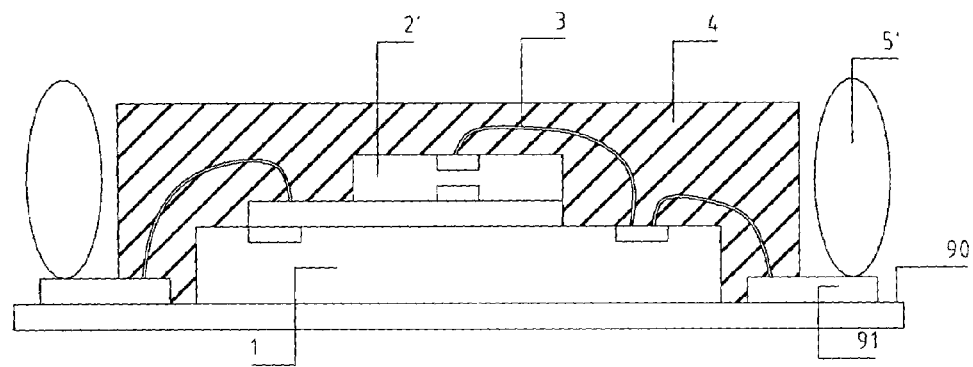

FIGS. 38 to 40 show three schematic, cross-sectional, flowcharts of a method for packaging an LED package structure according to the fifteenth best mold of the present invention, respectively.

Referring to FIG. 38, the same as the thirteenth best mold, a substrate 9 is provided and a first LED chip 1 is arranged on an installed surface 90 of the substrate 9. Afterward, the same as the fourth best mold, a second LED chip 2' is arranged on the first LED chip 1.

Referring to FIG. 39, the first LED chip 1 has a first electrode area 120 electrically connected with one corresponding conductive point 91 through one conductive wire 3, and a second electrode area 121 electrically connected with both a second electrode area 221 of the second LED chip 2' and another corresponding conductive point 91 through another two conductive wires 3.

Referring to FIG. 40, an insulating layer 4 is formed on a part of the installed surface 90 and a part of the conductive point 91, and is covered completely on the first LED chip 1 and the second LED chip 2. Next, an external electric conduction unit 5' is formed on the other part (without being covered by the insulating layer 4) of each conductive point 91 for electrically connecting with an external circuit (not shown).

Figure 41:
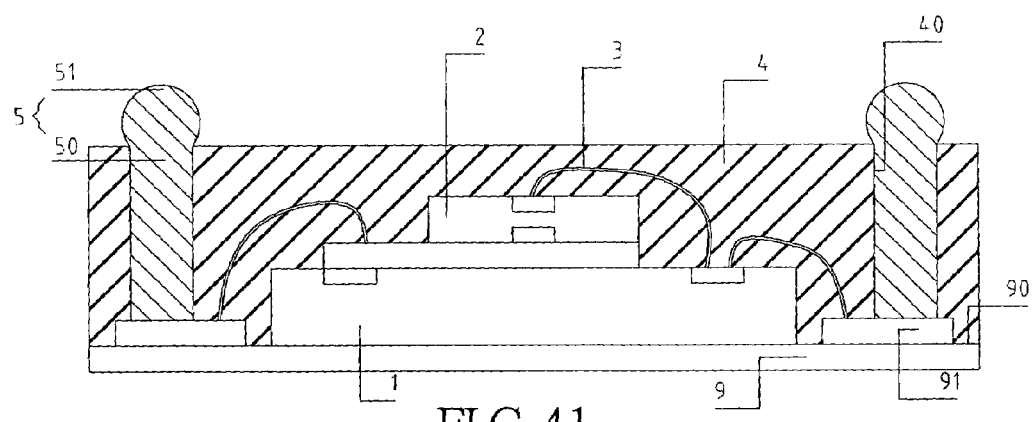
FIG. 41 is a schematic, cross-sectional view of a LED package structure according to the sixteenth best mold of the present invention.

FIG. 41 shows a schematic, cross-sectional view of a LED package structure according to the sixteenth best mold of the present invention.

The sixteenth best mold differed from the fifteenth best mold is that the insulating layer 4 is formed on a part of the installed surface 90 and above the installed surface 90 for completely covering the conductive points 91, the first LED chip 1 and the second LED chip 2. Afterward, the same as the first best mold, an external electric conduction unit 5 is formed in each exposed hole 40, and each of the external electric conduction units 5 includes a first portion 50 and a second portion 51.

Figure 42:
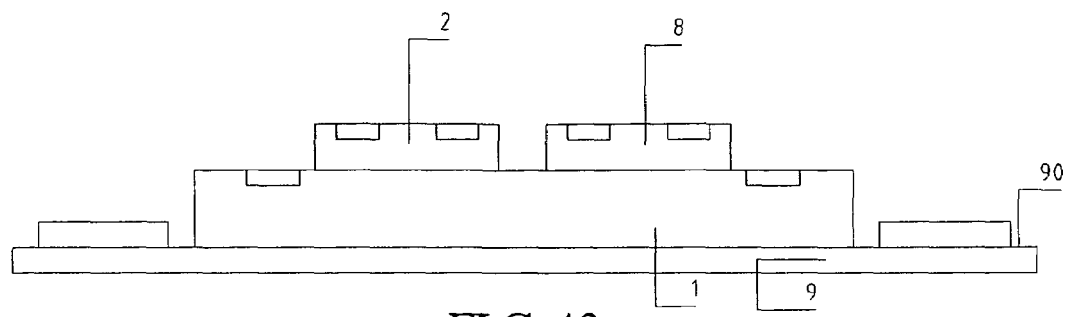
FIGS. 42 to 44 are three schematic, cross-sectional, flow-charts of a method for packaging an LED package structure according to the seventeenth best mold of the present invention, respectively.
Figure 43:
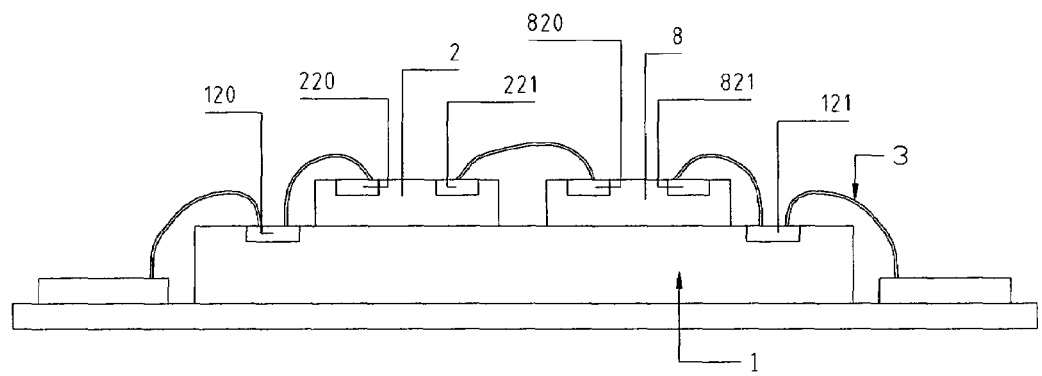
Figure 44:
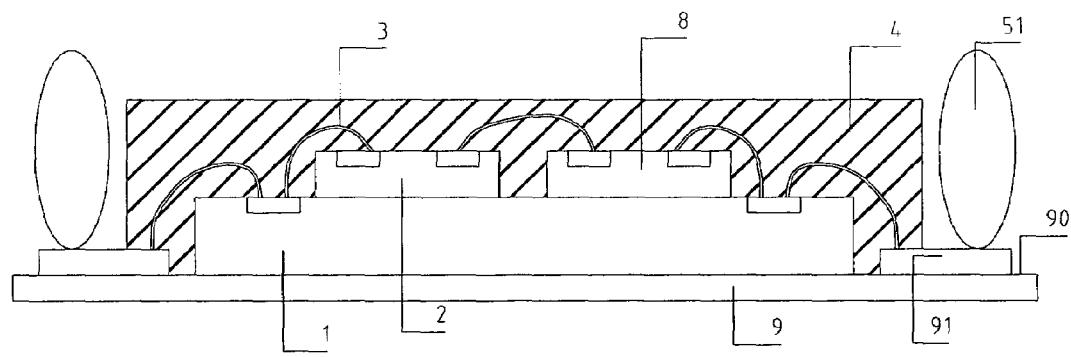

FIGS. 42 to 44 show three schematic, cross-sectional, flowcharts of a method for packaging an LED package structure according to the seventeenth best mold of the present invention, respectively.

Referring to FIG. 42, the same as the thirteenth best mold, a substrate 9 is provided and a first LED chip 1 is arranged on an installed surface 90 of the substrate 9.

Afterward, the same as the eighth best mold, both at least one second LED chip 2 and at least one third LED chip 8 are arranged on a minor light-emitting surface 11 of the first LED chip 1.

Referring to FIG. 43, the first LED chip 1 has a first electrode area 120 electrically connected with both one corresponding conductive point 91 and a first electrode area 220 of the second LED chip 2 through two conductive wires 3, and a second electrode area 121 electrically connected with both another corresponding conductive point 91 and a second electrode area 221 of the second LED chip 2 through another two conductive wires 3. The second LED chip 2 has a second electrode area 221 electrically connected with a first electrode area 820 of the third LED chip 8 through further conductive wire 3.

Referring to FIG. 44, an insulating layer 4 is formed on a part of the installed surface 90 and a part of the conductive point 91, and is covered completely on the first LED chip 1, the second LED chip 2 and the third LED chip 8.

Next, an external electric conduction unit 5' is formed on the other part (without being covered by the insulating layer 4) of each conductive point 91 for electrically connecting with an external circuit (not shown).

Figure 45:
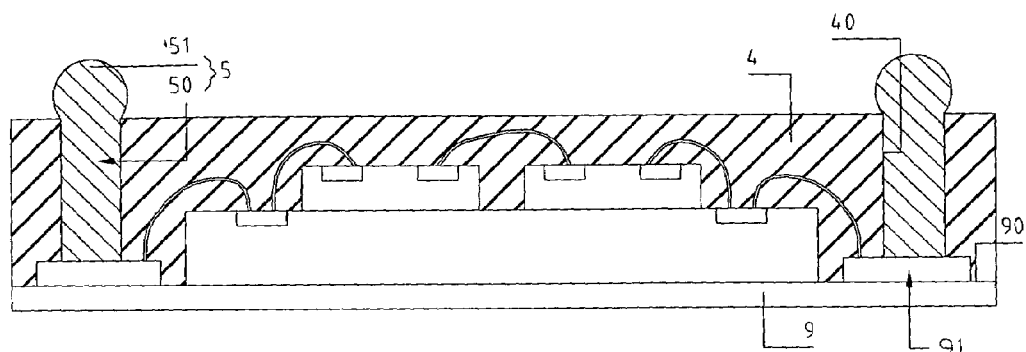
FIG. 45 is a schematic, cross-sectional view of a LED package structure according to the eighteenth best mold of the present invention.

FIG. 45 shows a schematic, cross-sectional view of a LED package structure according to the eighteenth best mold of the present invention.

The eighteenth best mold differed from the seventeenth best mold is that the insulating layer 4 is formed on a part of the installed surface 90 and above the installed surface 90 for completely covering the conductive points 91, the first LED chip 1, the second LED chip 2 and the third LED chip 8. Afterward, the same as the first best mold, an external electric conduction unit 5 is formed in each exposed hole 40, and each of the external electric conduction units 5 includes a first portion 50 and a second portion 51.

Figure 46:
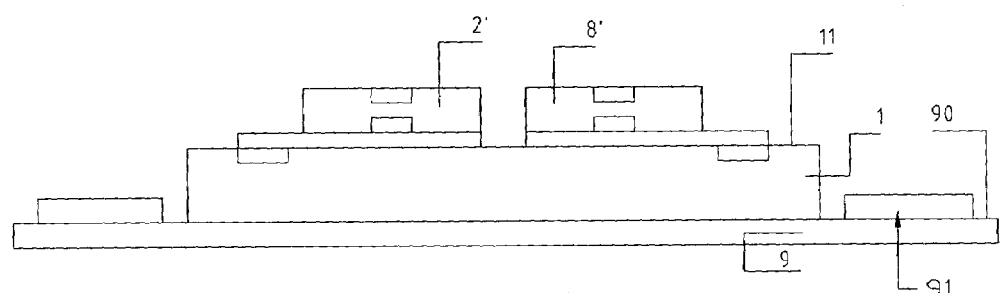
FIGS. 46 to 48 are three schematic, cross-sectional, flow-charts of a method for packaging an LED package structure according to the nineteenth best mold of the present invention, respectively.
Figure 47:
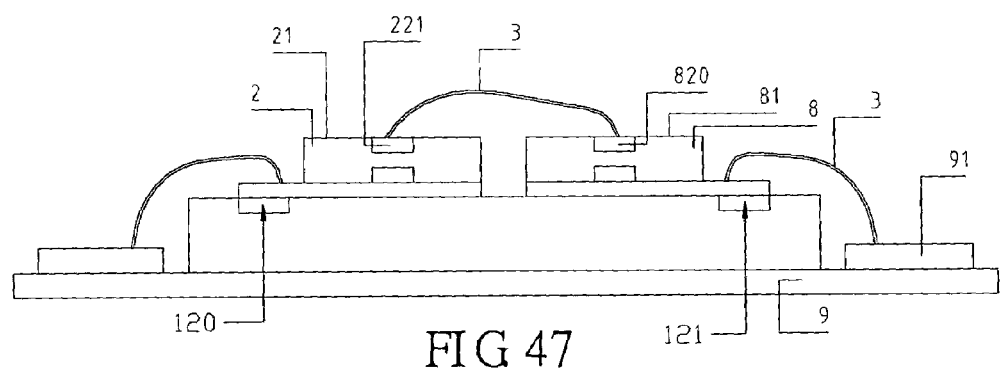
Figure 48:
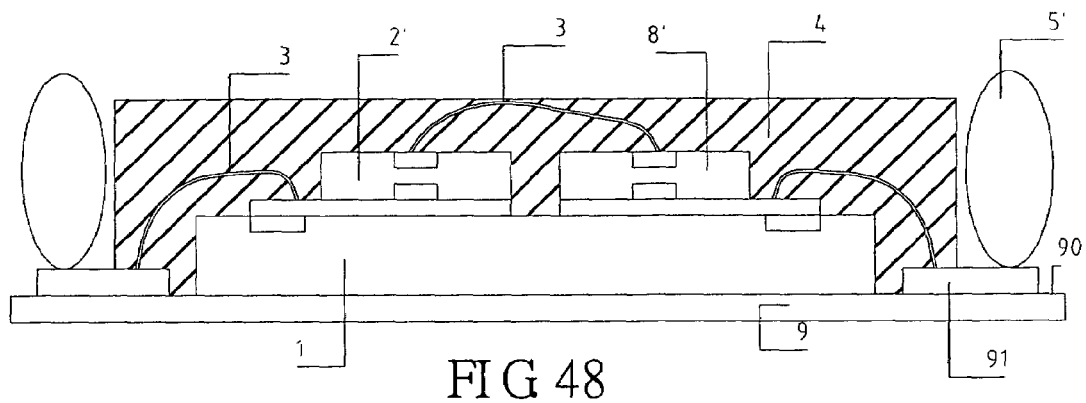

FIGS. 46 to 48 show three schematic, cross-sectional, flowcharts of a method for packaging an LED package structure according to the nineteenth best mold of the present invention, respectively.

Referring to FIG. 46, the same as the thirteenth best mold, a substrate 9 is provided and a first LED chip 1 is arranged on an installed surface 90 of the substrate 9.

Afterward, the same as the tenth best mold, both at least one second LED chip 2' and at least one third LED chip 8' are arranged on a minor light-emitting surface 11 of the first LED chip 1. Moreover referring to FIG. 47, the second LED chip 2' has a second electrode area 221 formed on a minor light-emitting surface 21 thereof, and the third LED chip 8' has a first electrode area 820 formed on a minor light-emitting surface 81 thereof. The second electrode area 221 is electrically connected with the first electrode area 820 though one conductive wire 3. In addition, the first LED chip 1 has a first electrode area 120 and a second electrode are 121 electrically connected with two corresponding conductive points 91 through another two conductive wires 3 respectively.

Referring to FIG. 48, an insulating layer 4 is formed on a part of the installed surface 90 and a part of the conductive point 91, and is covered completely on the first LED chip 1, the second LED chip 2' and the third LED chip 8'.

Next, an external electric conduction unit 5' is formed on the other part (without being covered by the insulating layer 4) of each conductive point 91 for electrically connecting with an external circuit (not shown).

Figure 49:
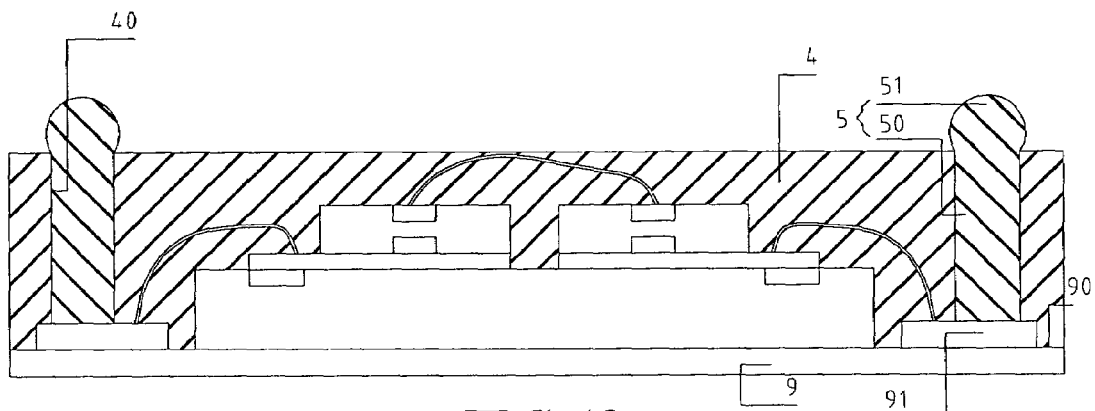
FIG. 49 is a schematic, cross-sectional view of a LED package structure according to the twentieth best mold of the present invention.

FIG. 49 shows a schematic, cross-sectional view of a LED package structure according to the twentieth best mold of the present invention.

The twentieth best mold differed from the nineteenth best mold is that the insulating layer 4 is formed on a part of the installed surface 90 and above the installed surface 90 for completely covering the conductive points 91, the first LED chip 1, the second LED chip 2' and the third LED chip 8'. Afterward, the same as the first best mold, an external electric conduction unit 5 is formed in each exposed hole 40, and each of the external electric conduction units 5 includes a first portion 50 and a second portion 51.

FIGS. 51 to 55 show five schematic, cross-sectional, flowcharts of a method for packaging an LED package structure according to the twenty-first best mold of the present invention, respectively.

Figure 51:
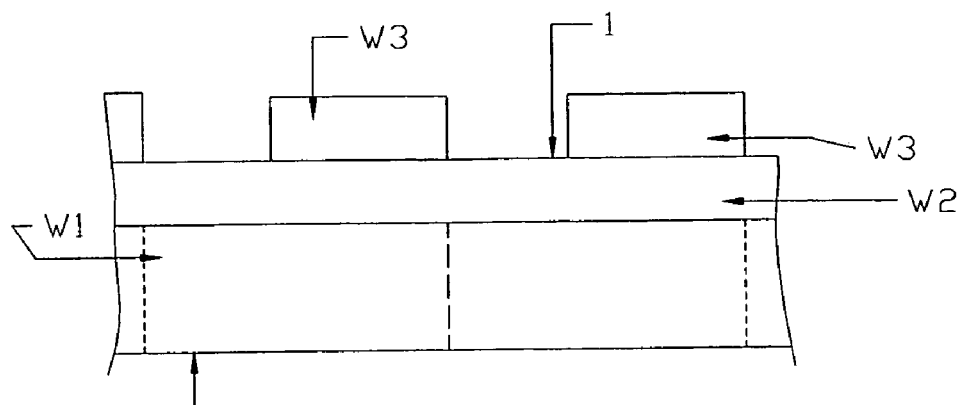
FIGS. 51 to 55 are five schematic, cross-sectional, flow-charts of a method for packaging an LED package structure according to the twenty-first best mold of the present invention, respectively.
Figure 52:
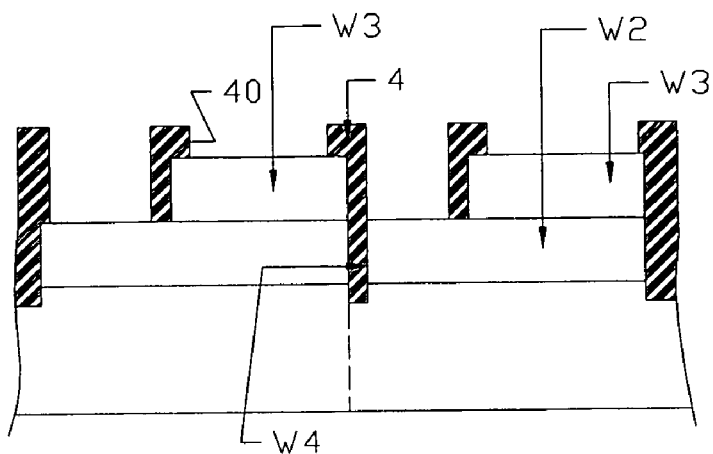

Referring to FIG. 51, a LED wafer W is provided. The LED wafer W has a plurality of LED chip areas. Moreover, in order to simplify the description, following best molds only show two LED chip areas on the LED wafer W. Each of the LED chips is cut along dotted lines such as cutting lines.

The LED wafer W has an industrial sapphire layer W1, a first electrode layer W2 with a first pole arranged on the industrial sapphire layer W1, and a plurality of second electrode layer W3 with a second pole arranged on the first electrode layer W2 and respectively corresponding to LED chip areas. Moreover, an insulating layer (not shown) is formed between the first electrode layer W2 and the second electrode layer W3.

Afterward, the LED wafer is cut to form concave grooves W4 for separating two first electrode layers W2 that are arranged in two LED chip areas D1 and D2 respectively.

Next, an insulating layer 4 is formed on the first electrode layer W2 and the second electrode layer W3, and the insulating layer 4 has a plurality of exposed holes 40 formed therein for exposing a corresponding part of the first electrode layer W2 and a corresponding part of the second electrode layer W3.

Figure 53:
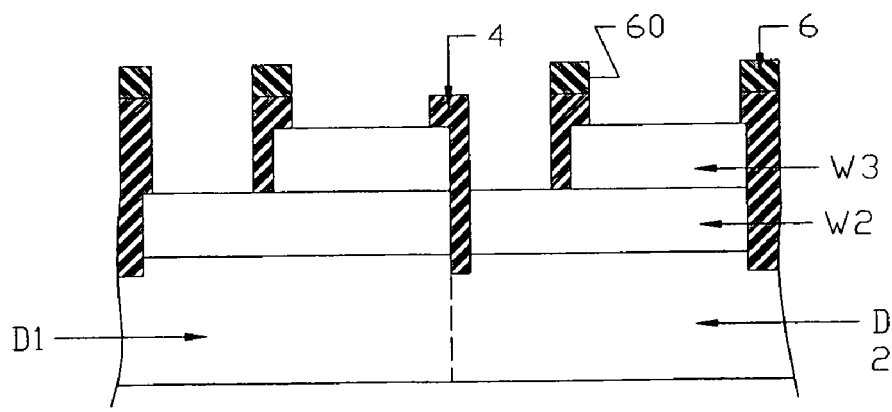

Moreover, referring to FIG. 53, a cover layer 6 is formed on the insulating layer 4 to form a plurality of communication holes 60. One exposed hole 40 for exposing the part of the second electrode layer W3 in the LED chip area D1 and another exposed hole 40 for exposing the part of the first electrode layer W2 in the LED chip area D2, are communicated with each other via the corresponding communication hole 60. The other exposed holes 40 for exposing the other electrode layers W2 and W3 in the LED chip areas D1 and D2 are communicated with the other corresponding communication holes 60.

Figure 54:
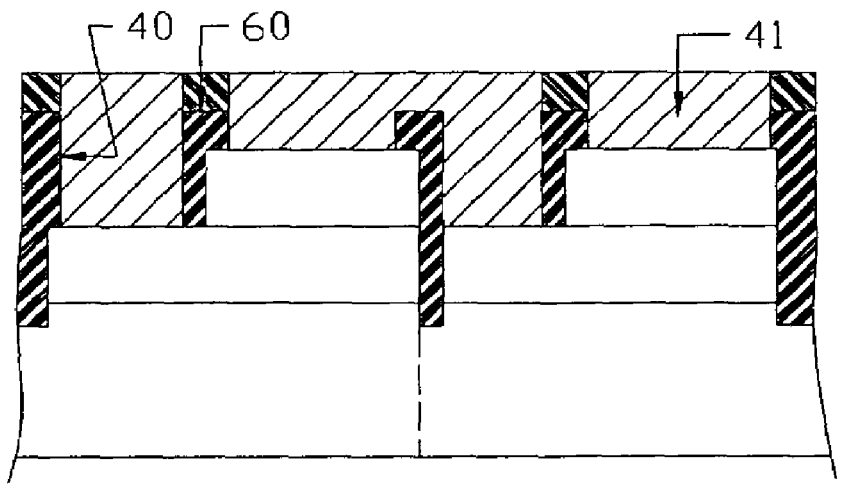

Referring to FIG. 54, a conductive body 41 is formed in each corresponding exposed hole 40 and each communication hole 60 that is communicated with the corresponding exposed hole 40.

Figure 55:
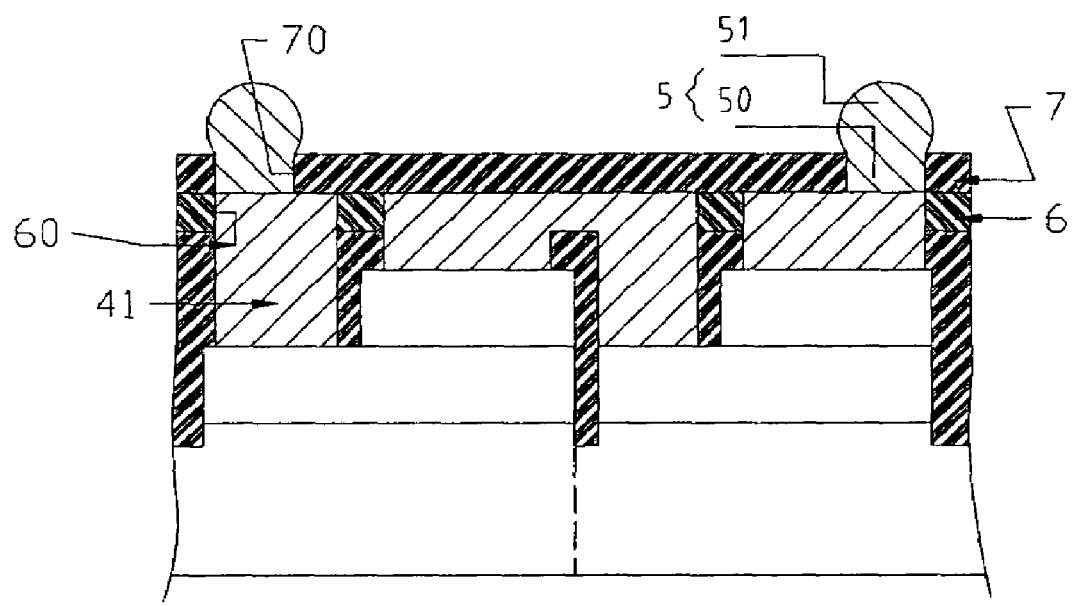

Next, referring to FIG. 55, a protection layer 7 is formed on the cover layer 6, and the protection layer 7 has a plurality of through holes 70 formed therein and each through hole is used to expose a part of each corresponding conductive body 41.

Furthermore, the same as the first best mold, an external electric conduction unit 5 is formed in each exposed hole 40, and each external electric conduction unit 5 has a first portion 50 for electrically connecting with the corresponding conductive body 14, and a second portion 51 electrically connected with the first portion 50 and projected outside the corresponding through hole 70.

Finally, the LED wafer W is cut. Hence each LED package structure has two LED chip areas such as above-mentioned two LED chip area D1 and D2 that are electrically connected together.

FIGS. 56 to 62 show seven schematic, cross-sectional, flowcharts of a method for packaging an LED package structure according to the twenty-second best mold of the present invention, respectively.

Figure 56:
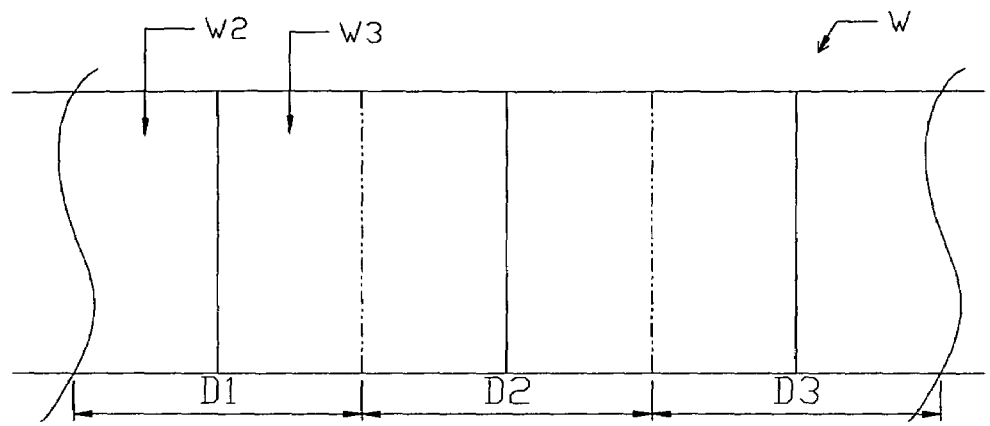
FIGS. 56 to 62 are seven schematic, cross-sectional, flow-charts of a method for packaging an LED package structure according to the twenty-second best mold of the present invention, respectively.
Figure 59:
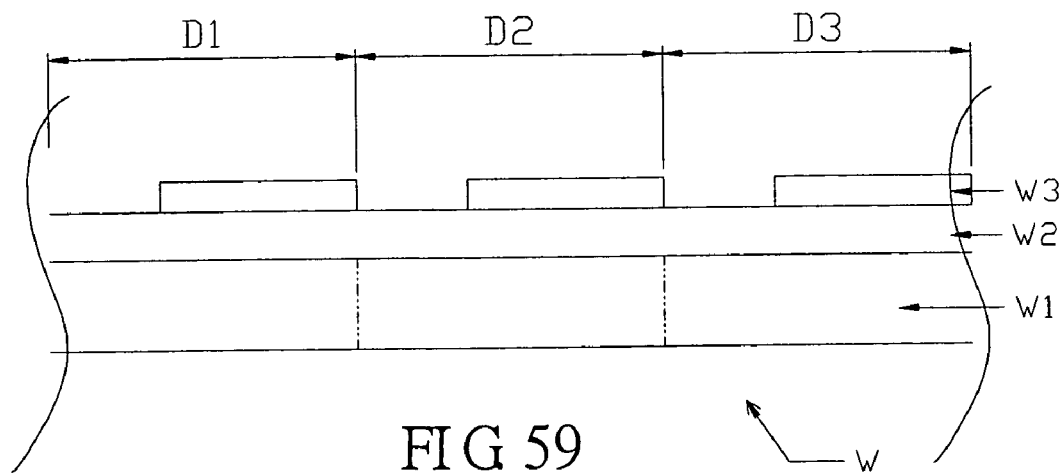

Referring to FIGS. 56 and 59, FIG. 59 shows a side view according to FIG. 56. Firstly, a LED wafer W is provided. The LED wafer W has a plurality of LED chip areas. Moreover, in order to simplify the description, following best molds only show three LED chip areas on the LED wafer W. Each of the LED chips is cut along dotted lines such as cutting lines.

Figure 57:
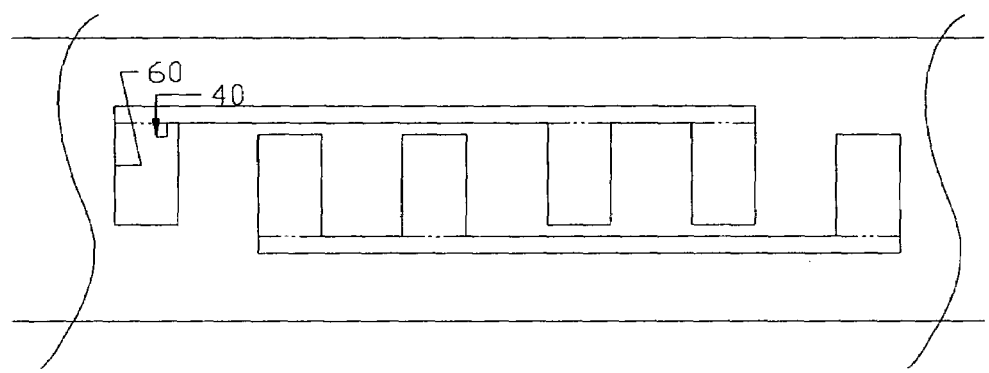
Figure 60:
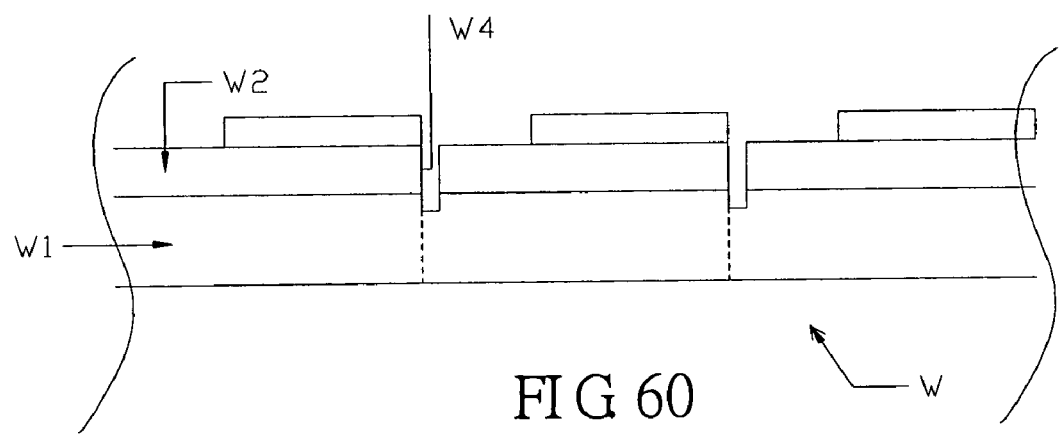
Figure 61:
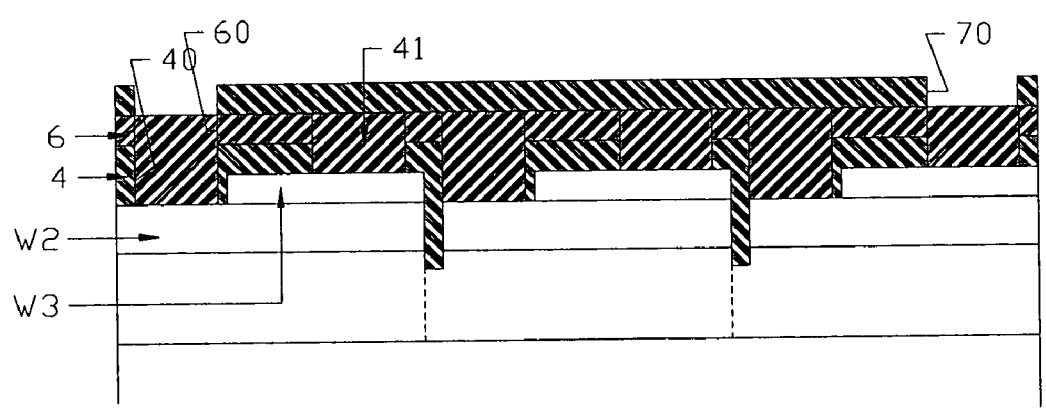

Referring to FIGS. 57 and 60, the LED wafer W has an industrial sapphire layer W1, a first electrode layer W2 with a first pole arranged on the industrial sapphire layer W1, and a plurality of second electrode layer W3 with a second pole arranged on the first electrode layer W2 and respectively corresponding to LED chip areas. Moreover, an insulating layer (not shown) is formed between the first electrode layer W2 and the second electrode layer W3.

Afterward, the LED wafer is cut to form concave grooves W4 for separating two first electrode layers W2 that are arranged in two LED chip areas D1 and D2 respectively, and separating two first electrode layers W2 that are arranged in two LED chip areas D2 and D3 respectively.

Next, an insulating layer 4 is formed on the first electrode layer W2 and the second electrode layer W3, and the insulating layer 4 has a plurality of exposed holes 40 formed therein for exposing a corresponding part of the first electrode layer W2 and a corresponding part of the second electrode layer W3.

Moreover, referring to FIG. 57, a cover layer 6 is formed on the insulating layer 4 to form a plurality of communication holes 60. Two exposed holes 40 for respectively exposing the two electrode layers W2 or W3 in two of the LED chip areas (D1, D2, D3) and another exposed hole 40 for exposing the electrode layer W3 (the polarity is opposite to W2) or W2 (the polarity is opposite to W3) in the other LED chip area, are communicated with each other via the corresponding communication hole 60.

Figure 58:
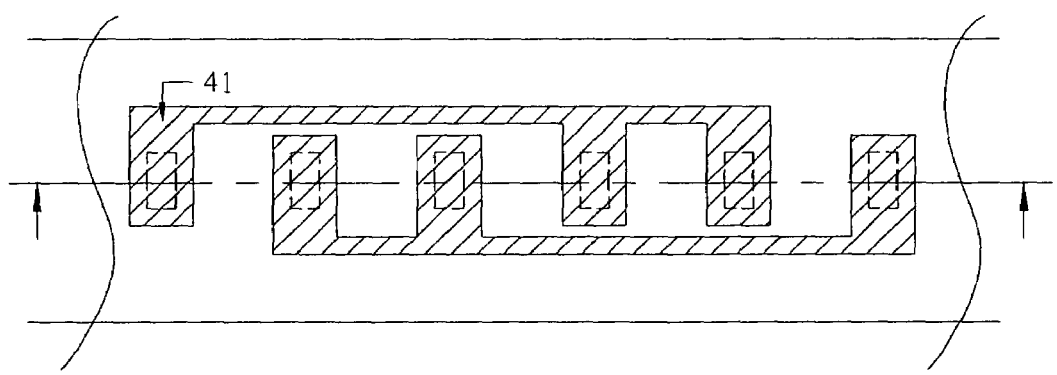

Referring to FIG. 58, a conductive body 41 is formed in each corresponding exposed hole 40 and each communication hole 60 that is communicated with the corresponding exposed hole 40.

Next, a protection layer 7 is formed on the cover layer 6, and the protection layer 7 has a plurality of through holes 70 formed therein for exposing a part of the corresponding conductive bodies 41.

Figure 62:
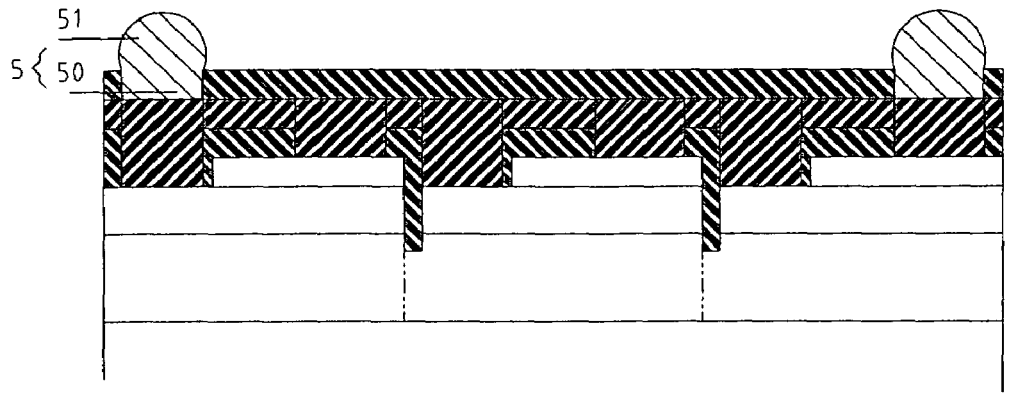

Furthermore, referring to FIG. 62, the same as the first best mold, an external electric conduction unit 5 is formed in each exposed hole 40, and each of the external electric conduction units 5 includes a first portion 50 and a second portion 51.

Finally, the LED wafer W is cut. Hence each LED package structure has three LED chip areas such as above-mentioned three LED chip area D1, D2 and D3 that are electrically connected together.

One of the three LED chip areas is to be an antistatic element.

FIGS. 63 to 66 show four schematic, cross-sectional, flowcharts of a method for packaging an LED package structure according to the twenty-third best mold of the present invention, respectively.

The same as the twenty-second best mold, firstly a LED wafer W is provided (referring to FIGS. 56 and 59). The LED wafer W has a plurality of LED chip areas. Moreover, the LED wafer W has an industrial sapphire layer W1, a first electrode layer W2 with a first pole arranged on the industrial sapphire layer W1, and a plurality of second electrode layer W3 with a second pole arranged on the first electrode layer W2 and respectively corresponding to LED chip areas. Moreover, an insulating layer (not shown) is formed between the first electrode layer W2 and the second electrode layer W3.

Afterward, the same as the twenty-second best mold such as FIG. 60, the LED wafer is cut to form concave grooves W4 for separating two first electrode layers W2 that are arranged in two LED chip areas D1 and D2 respectively, and separating two first electrode layers W2 that are arranged in two LED chip areas D2 and D3 respectively.

Next, an insulating layer 4 is formed on the first electrode layer W2 and the second electrode layer W3, and the insulating layer 4 has a plurality of exposed holes 40 formed therein for exposing a corresponding part of the first electrode layer W2 and a corresponding part of the second electrode layer W3.

Figure 63:
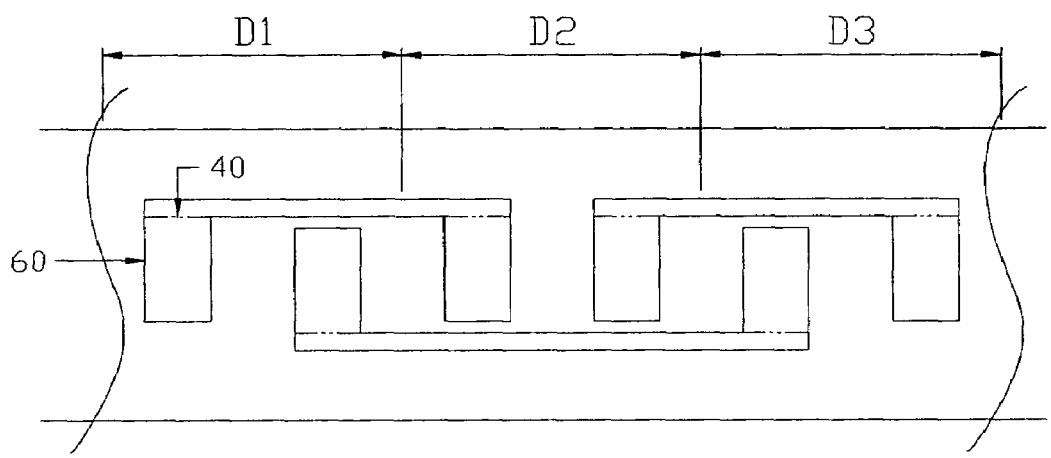
FIGS. 63 to 66 are four schematic, cross-sectional, flow-charts of a method for packaging an LED package structure according to the twenty-third best mold of the present invention, respectively.

Moreover, referring to FIG. 63, a cover layer 6 is formed on the insulating layer 4 to form a plurality of communication holes 60. One exposed hole 40 for exposing the part of the first electrode layer W2 in the first LED chip area D1 and another exposed hole 40 for exposing the part of the first electrode layer W2 in the second LED chip area D2, are communicated with each other via one communication hole 60. One exposed hole 40 for exposing the part of the second electrode layer W3 in the first LED chip area D1 and another exposed hole 40 for exposing the part of the first electrode layer W2 in the third LED chip area D3, are communicated with each other via another communication hole 60. One exposed hole 40 for exposing the part of the second electrode layer W3 in the second LED chip area D2 and another exposed hole 40 for exposing the part of the second electrode layer W3 in the third LED chip area D3, are communicated with each other via another communication hole 60.

Figure 64:
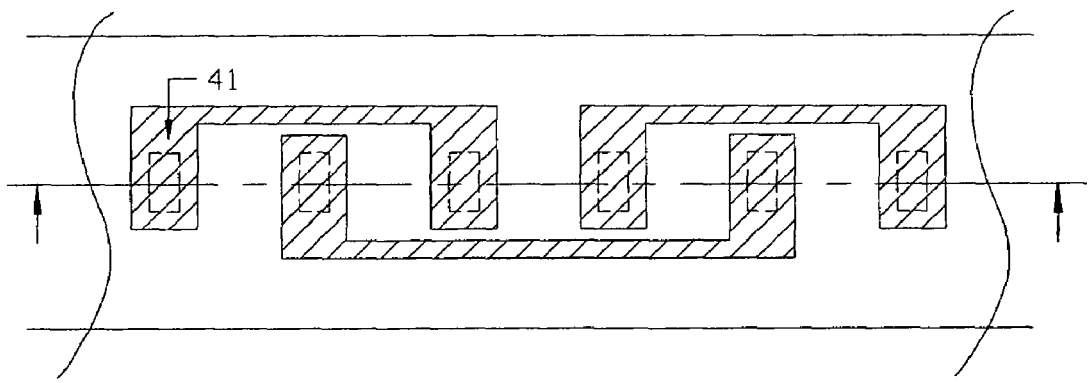
Figure 65:
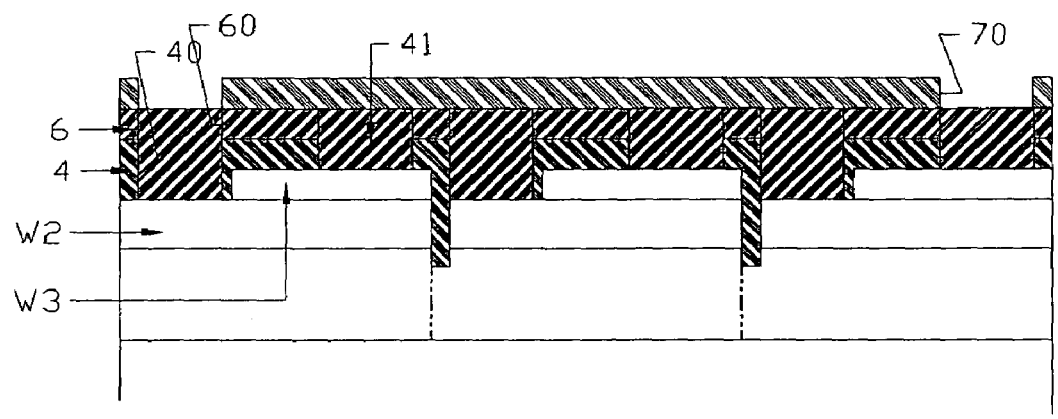
Figure 66:
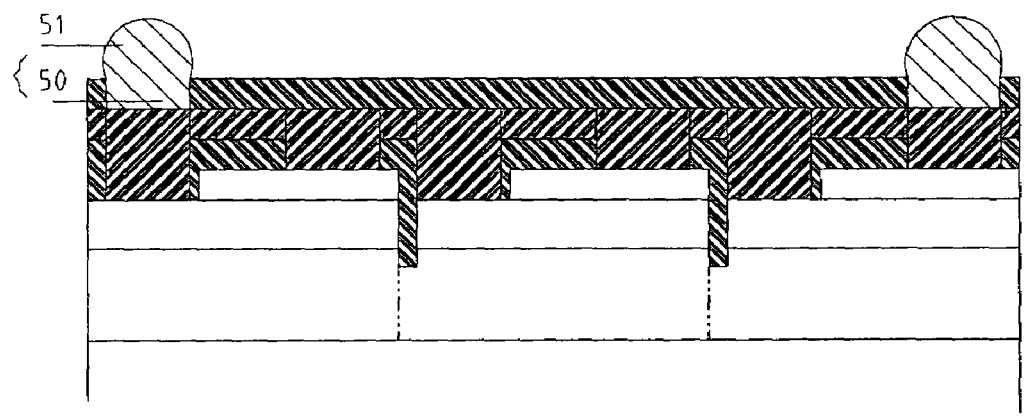

Referring to FIG. 64, a conductive body 41 is formed in each corresponding exposed hole 40 and each communication hole 60 that is communicated with the corresponding exposed hole 40.

Next, a protection layer 7 is formed on the cover layer 6, and the protection layer 7 has a plurality of through holes 70 formed therein. One through hole 70 is used to expose a part of the conductive body 41 that is connected with first electrode layer W2 in the first LED chip area D1, and another through hole 70 is used to expose a part of the conductive body 41 that is connected with second electrode layer W3 in the third LED chip area D3.

Furthermore, the same as the first best mold, an external electric conduction unit 5 is formed in each exposed hole 40, and each of the external electric conduction units 5 includes a first portion 50 and a second portion 51.

Finally, the LED wafer W is cut. Hence each LED package structure has three LED chip areas such as above-mentioned three LED chip area D1, D2 and D3 that are electrically connected together.

One of the three LED chip areas is to be an antistatic element.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An LED package structure, comprising: a first LED chip for triggering to generate first color light, wherein the first LED chip has a major light-emitting surface, a minor light-emitting surface opposite to the major light-emitting surface, at least one first electrode area with a first pole arranged on one side of the minor light-emitting surface, and a second electrode area with a second pole arranged on opposite side of the minor light-emitting surface, wherein the polarity of the first electrode area is opposite to the second electrode area, and external light is allowed to pass through the minor light-emitting surface;

at least one second LED chip for triggering to generate second color light, wherein the at least one second LED chip is arranged on the minor light-emitting surface of the first LED chip, and the second LED chip has a major light-emitting surface, a minor light-emitting surface opposite to the major light-emitting surface, a first electrode area with a first pole formed on one of the major and minor light-emitting surfaces, and a second electrode area with a second pole arranged on one of the major and the minor light-emitting surfaces;

a conductive unit connected between the electrode areas for parallel or serially connecting the two LED chips together;

at least two external electric conduction units for electrically connecting both the first and second electrode areas of the first LED chip with an external circuit;

an insulating layer formed on the minor light-emitting surface of the first LED chip and covered completely on the second LED chip, wherein the insulating layer has a plurality of exposed holes formed therein for exposing the corresponding electrode areas;

a cover layer formed on the insulating layer to define a plurality of communication holes, wherein each two corresponding exposed holes for exposing corresponding electrode areas are communicated to each other via each communication hole;

a plurality of conductive bodies, each conductive body has the external electric conduction unit formed in each communication hole and each two corresponding exposed holes; and a protection layer formed on the cover layer, wherein the protection layer has a plurality of through holes formed therein for exposing a part of the corresponding conductive bodies;

wherein the first color light is different from the second color light, and the first color light and the second color light are mixed to form a predetermined color light; and wherein both the first electrode area and the second electrode area of the at least one second LED chip are arranged on the minor light-emitting surface of the second LED chip, the major light-emitting surface of the second LED chip faces the minor light-emitting surface of the first LED chip, and the second LED chip is arranged on the minor light-emitting surface of the first LED chip; and wherein each of the external electric conduction units is formed in each corresponding through hole, and each external electric conduction unit has a first portion for electrically connecting with the corresponding conductive body, and a second portion electrically connected with the first portion and projected outside the corresponding through hole.

2. The LED package structure as claimed in claim 1, further comprising at least one third LED chip for triggering to generate third color light;

wherein the at least one third LED chip is arranged on the minor light-emitting surface of the first LED chip, and the third LED chip has a major light-emitting surface, a minor light-emitting surface opposite to the major light-emitting surface, a first electrode area with a first pole formed on one of the major and minor light-emitting surfaces, and a second electrode area with a second pole arranged on one of the major and the minor light-emitting surfaces;

wherein the electrode areas of the third LED chip are electrically connected with the corresponding electrode areas of the first LED chip and the corresponding electrode areas of the second LED chip via the conductive unit.

3. The LED package structure as claimed in claim 1, wherein the first color light is same as the second color light, and the first color light and the second color light are mixed to increase the intensity of the color light.

4. The LED package structure as claimed in claim 2, wherein the first color light, the second color light and the third color light are all different, and the first color light, the second color light and the third color light all are mixed to form a predetermined color light.

5. The LED package structure as claimed in claim 3, wherein both the first electrode area and the second electrode area of the at least one second LED chip are arranged on the minor light-emitting surface of the second LED chip, the major light-emitting surface of the second LED chip faces the minor light-emitting surface of the first LED chip, and the second LED chip is arranged on the minor light-emitting surface of the first LED chip.

6. The LED package structure as claimed in claim 1, wherein the first LED chip is triggered to generate light with light wavelength range between 450 nm to 470 nm, and the second LED chip is triggered to generate light with light wavelength range between 570 nm to 590 nm.

7. The LED package structure as claimed in claim 2, wherein the first LED chip is triggered to generate light with light wavelength range between 450 nm to 470 nm, the second LED chip is triggered to generate light with light wavelength range between 520 nm to 540 nm, and the third LED chip is triggered to generate light with light wavelength range between 610 nm to 630 nm.

8. The LED package structure as claimed in claim 4,
wherein both the first electrode area and the second electrode area of the at least one third LED chip are arranged on the minor light-emitting surface of the second LED chip, the major light-emitting surface of the third LED chip faces the minor light-emitting surface of the first LED chip, and the third LED chip is arranged on the minor light-emitting surface of the first LED chip.

9. The LED package structure as claimed in claim 3, wherein one of the electrode areas of the at least one second LED chip is arranged on the major light-emitting surface of the second LED chip, and the other electrode area of the at least one second LED chip is arranged on the minor light-emitting surface of the second LED chip; wherein the major light-emitting surface of the second LED chip faces the minor light-emitting surface of the first LED chip, and the second LED chip is arranged on the minor light-emitting surface of the first LED chip.

10. The LED package structure as claimed in claim 4, wherein the first electrode area and the second electrode area of the second LED chip are respectively formed on the major light-emitting surface and minor light-emitting surface of the second LED chip, and the major light-emitting surface of the second LED chip faces the minor light-emitting surface of the first LED chip and the second LED chip is arranged on the minor light-emitting surface of the first LED chip; wherein the first electrode area and the second electrode area of the third LED chip are respectively formed on the major light-emitting surface and minor light-emitting surface of the third LED chip, and the major light-emitting surface of the third LED chip faces the minor light-emitting surface of the first LED chip and the third LED chip is arranged on the minor light-emitting surface of the first LED chip.

11. A method for packaging an LED package structure, comprising:

providing a first LED chip for triggering to generate first color light, wherein the first LED chip has a major light-emitting surface, a minor light-emitting surface opposite to the major light-emitting surface, at least one first electrode area with a first pole arranged on one side of the minor light-emitting surface, and a second electrode area with a second pole arranged on opposite side of the minor light-emitting surface, wherein the polarity of the first electrode area is opposite to the second electrode area, and external light is allowed to pass through the minor light-emitting surface;

providing at least one second LED chip for triggering to generate second color light, wherein the at least one second LED chip is arranged on the minor light-emitting surface of the first LED chip, and the second LED chip has a major light-emitting surface, a minor light-emitting surface opposite to the major light-emitting surface, a first electrode area with a first pole formed on one of the major and minor light-emitting surfaces, and a second electrode area with a second pole arranged on one of the major and the minor light-emitting surfaces;

setting a conductive unit connected between the electrode areas for parallel or serially connecting the two LED chips together;

forming at least two external electric conduction units for electrically connecting both the first and second electrode areas of the first LED chip with an external circuit;

providing an insulating layer formed on the minor light-emitting surface of the first LED chip and covered completely on the second LED chip, wherein the insulating layer has a plurality of exposed holes formed therein for exposing the corresponding electrode areas;

providing a cover layer formed on the insulating layer to define a plurality of communication holes, wherein each two corresponding exposed holes for exposing corresponding electrode areas are communicated to each other via each communication hole;

providing a plurality of conductive bodies, each conductive body has the external electric conduction unit formed in each communication hole and each two corresponding exposed holes; and providing a protection layer formed on the cover layer, wherein the protection layer has a plurality of through holes formed therein for exposing a part of the corresponding conductive bodies;

wherein each of the external electric conduction units is formed in each corresponding through hole, and each external electric conduction unit has a first portion for electrically connecting with the corresponding conductive body, and a second portion electrically connected with the first portion and projected outside the corresponding through hole;

wherein the first color light is different from the second color light, and the first color light and the second color light are mixed to form a predetermined color light; and wherein both the first electrode area and the second electrode area of the at least one second LED chip are arranged on the minor light-emitting surface of the second LED chip, the major light-emitting surface of the second LED chip faces the minor light-emitting surface of the first LED chip, and the second LED chip is arranged on the minor light-emitting surface of the first LED chip.

12. The method as claimed in claim 11, further comprising providing at least one third LED chip for triggering to generate third color light;

wherein the at least one third LED chip is arranged on the minor light-emitting surface of the first LED chip, and the third LED chip has a major light-emitting surface, a minor light-emitting surface opposite to the major light-emitting surface, a first electrode area with a first pole formed on one of the major and minor light-emitting surfaces, and a second electrode area with a second pole arranged on one of the major and the minor light-emitting surfaces;

wherein the electrode areas of the third LED chip are electrically connected with the corresponding electrode areas of the first LED chip and the corresponding electrode areas of the second LED chip via the conductive unit.

13. The method as claimed in claim 11, wherein the first color light is same as the second color light, and the first color light and the second color light are mixed to increase the intensity of the color light.

14. The method as claimed in claim 12, wherein the first color light, the second color light and the third color light are all different, and the first color light, the second color light and the third color light all are mixed to form a predetermined color light.

15. The method as claimed in claim 13, wherein both the first electrode area and the second electrode area of the at least one second LED chip are arranged on the minor light-emitting surface of the second LED chip, the major light-emitting surface of the second LED chip faces the minor light-emitting surface of the first LED chip, and the second LED chip is arranged on the minor light-emitting surface of the first LED chip.

16. The method as claimed in claim 11, wherein the first LED chip is triggered to generate light with light wavelength range between 450 nm to 470 nm, and the second LED chip is triggered to generate light with light wavelength range between 570 nm to 590 nm.

17. The method as claimed in claim 12, wherein the first LED chip is triggered to generate light with light wavelength range between 450 nm to 470 nm, the second LED chip is triggered to generate light with light wavelength range between 520 nm to 540 nm, and the third LED chip is triggered to generate light with light wavelength range between 610 nm to 630 nm.

18. The method as claimed in claim 11, wherein the conductive unit comprises two conductive wires for electrically connecting electrode areas with same polarity together;

wherein the method further comprises providing an insulating layer formed on the minor light-emitting surface of the first LED chip and covered completely on the second LED chip, and the insulating layer has a plurality of exposed holes formed therein for exposing the corresponding electrode areas of the first LED chip;

wherein each of the external electric conduction units is formed in each corresponding exposed hole, and each external electric conduction unit has a first portion for electrically connecting with the corresponding electrode area of the first LED chip, and a second portion electrically connected with the first portion and projected outside the corresponding exposed hole.

19. The method as claimed in claim 14, wherein both the first electrode area and the second electrode area of the at least one second LED chip are arranged on the minor light-emitting surface of the second LED chip, the major light-emitting surface of the second LED chip faces the minor light-emitting surface of the first LED chip, and the second LED chip is arranged on the minor light-emitting surface of the first LED chip;

wherein both the first electrode area and the second electrode area of the at least one third LED chip are arranged on the minor light-emitting surface of the second LED chip, the major light-emitting surface of the third LED chip faces the minor light-emitting surface of the first LED chip, and the third LED chip is arranged on the minor light-emitting surface of the first LED chip.

20. The method as claimed in claim 13, wherein one of the electrode areas of the at least one second LED chip is arranged on the major light-emitting surface of the second LED chip, and the other electrode area of the at least one second LED chip is arranged on the minor light-emitting surface of the second LED chip; wherein the major light-emitting surface of the second LED chip faces the minor light-emitting surface of the first LED chip, and the second LED chip is arranged on the minor light-emitting surface of the first LED chip.

21. The method as claimed in claim 14, wherein the first electrode area and the second electrode area of the second LED chip are respectively formed on the major light-emitting surface and minor light-emitting surface of the second LED chip, and the major light-emitting surface of the second LED chip faces the minor light-emitting surface of the first LED chip and the second LED chip is arranged on the minor light-emitting surface of the first LED chip; wherein the first electrode area and the second electrode area of the third LED chip are respectively formed on the major light-emitting surface and minor light-emitting surface of the third LED chip, and the major light-emitting surface of the third LED chip faces the minor light-emitting surface of the first LED chip and the third LED chip is arranged on the minor light-emitting surface of the first LED chip.

* * * * *